United States Patent
Xie et al.

(10) Patent No.: US 12,142,526 B2
(45) Date of Patent: Nov. 12, 2024

(54) STACKED DEVICE WITH BURIED INTERCONNECT

(71) Applicant: International Business Machines Corporation, Armonk, NY (US)

(72) Inventors: Ruilong Xie, Niskayuna, NY (US);
Chen Zhang, Guilderland, NY (US);
Heng Wu, Santa Clara, CA (US);
Julien Frougier, Albany, NY (US);
Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 17/656,174

(22) Filed: Mar. 23, 2022

(65) Prior Publication Data

US 2023/0307296 A1 Sep. 28, 2023

(51) Int. Cl.
*H01L 21/768* (2006.01)
*H01L 29/06* (2006.01)
*H01L 29/417* (2006.01)

(52) U.S. Cl.
CPC .. *H01L 21/76897* (2013.01); *H01L 21/76802* (2013.01); *H01L 21/76847* (2013.01); *H01L 29/0649* (2013.01); *H01L 29/41725* (2013.01)

(58) Field of Classification Search
CPC ......... H01L 21/76897; H01L 21/76802; H01L 21/76847; H01L 21/823878; H01L 21/823425; H01L 21/8221; H01L 29/0649; H01L 29/41725; H01L 29/41766; H01L 29/42392; H01L 29/78696; H01L 27/092; H01L 27/088; H01L 27/0688
See application file for complete search history.

(56) References Cited

U.S. PATENT DOCUMENTS

| | | | |
|---|---|---|---|
| 9,659,963 B2 | 5/2017 | Cheng et al. | |
| 9,837,414 B1 | 12/2017 | Balakrishnan et al. | |
| 10,192,867 B1 | 1/2019 | Frougier et al. | |
| 10,388,519 B2 | 8/2019 | Smith et al. | |
| 10,770,479 B2 | 9/2020 | Smith et al. | |
| 11,984,401 B2* | 5/2024 | Xie | H01L 27/0924 |
| 2018/0175034 A1* | 6/2018 | Goktepeli | H01L 21/823878 |
| 2018/0190670 A1 | 7/2018 | Ryckaert et al. | |
| 2019/0131394 A1* | 5/2019 | Reznicek | H01L 21/30604 |
| 2020/0294998 A1* | 9/2020 | Lilak | H01L 23/53295 |
| 2021/0118798 A1 | 4/2021 | Liebmann et al. | |
| 2022/0359375 A1* | 11/2022 | Huang | H01L 21/845 |

(Continued)

OTHER PUBLICATIONS

J. Ryckaert et al., "Enabling Sub-5nm CMOS Technology Scaling Thinner and Taller!," International Electron Devices Meeting (IEDM), 2019, 29.4, 4 pp.

(Continued)

*Primary Examiner* — Dao H Nguyen
(74) *Attorney, Agent, or Firm* — Patterson + Sheridan, LLP

(57) ABSTRACT

A stacked field-effect transistors (FETs) layout and a method for fabrication are provided. The stacked FETs include a buried interconnect within the stacked devices which provides power to buried components without requiring a wired connection from a top of the stacked FET to the buried components. The buried interconnect allows for efficient scaling of the stacked devices without extraneous wiring from a top of the device to each epitaxial region/device within the overall device.

20 Claims, 38 Drawing Sheets

(56) References Cited

U.S. PATENT DOCUMENTS

| | | | |
|---|---|---|---|
| 2023/0197569 A1* | 6/2023 | Dewey | H01L 29/66439 |
| | | | 257/401 |
| 2023/0197777 A1* | 6/2023 | Dewey | H01L 21/823871 |
| | | | 257/288 |
| 2023/0197815 A1* | 6/2023 | Huang | H01L 29/78696 |
| | | | 257/288 |
| 2023/0395718 A1* | 12/2023 | Rachmady | H01L 27/0688 |
| 2024/0079401 A1* | 3/2024 | Or-Bach | H01L 29/66795 |

OTHER PUBLICATIONS

Anshul Gupta et al., "High-Aspect-Ratio Ruthenium Lines for Buried Power Rail," International Interconnect Technology Conference (IITC), 2018, pp. 4-6.

* cited by examiner

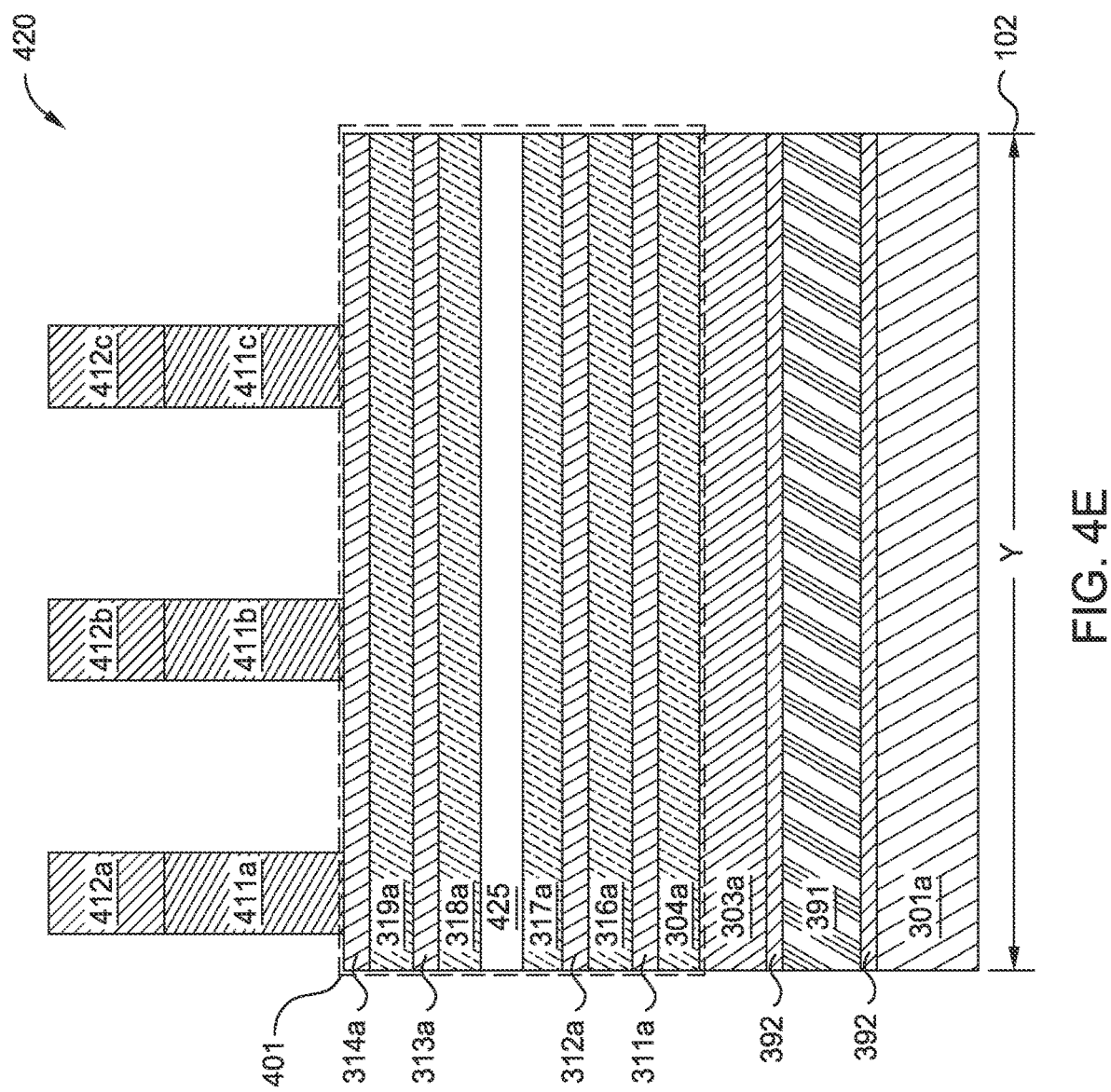

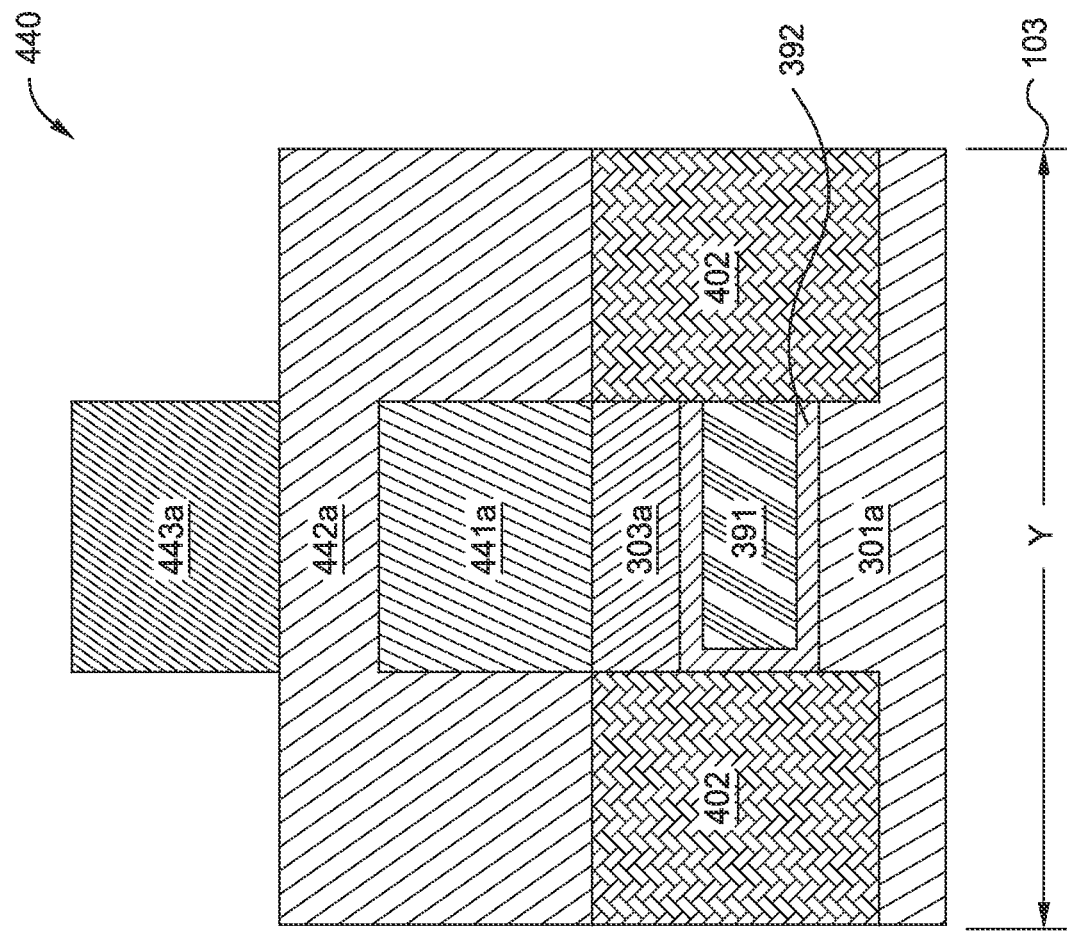

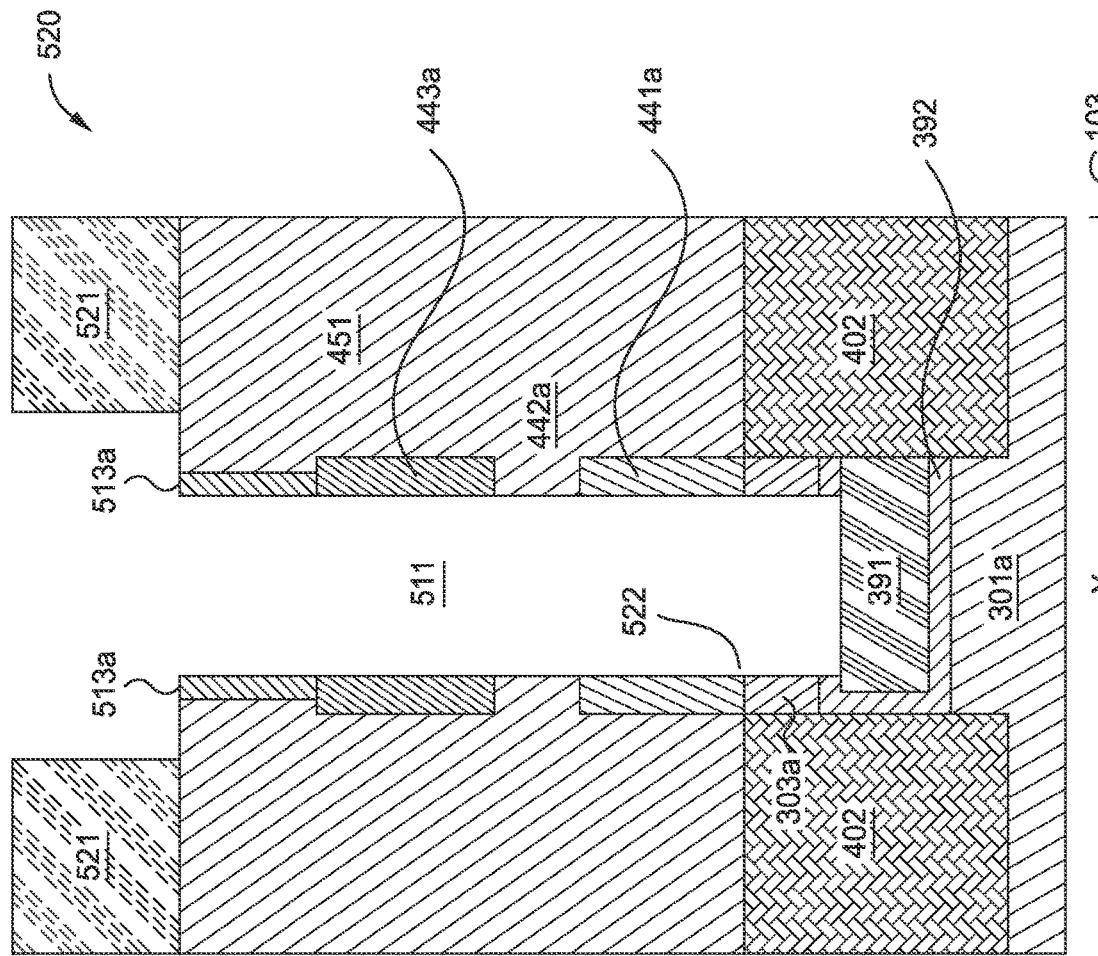

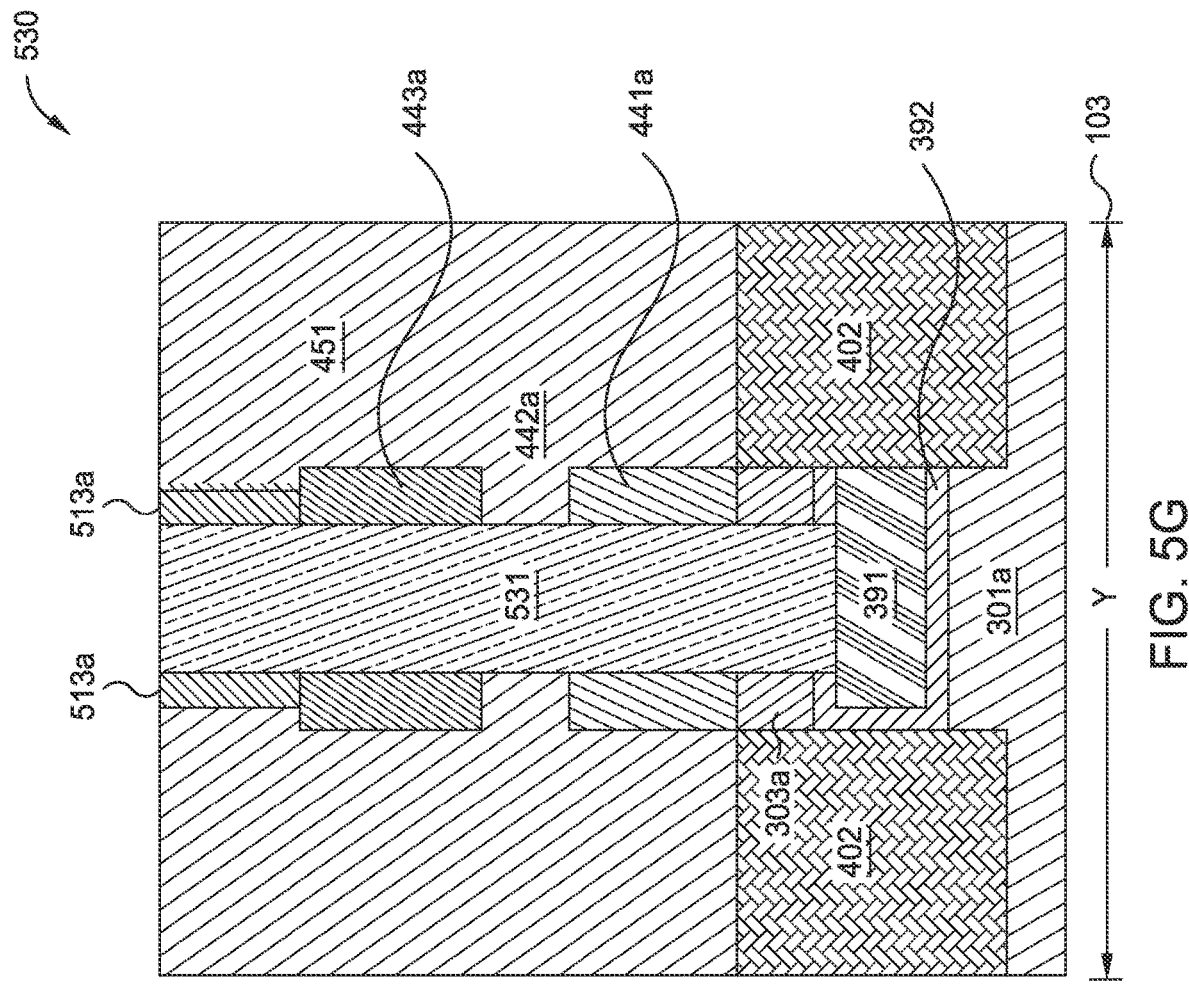

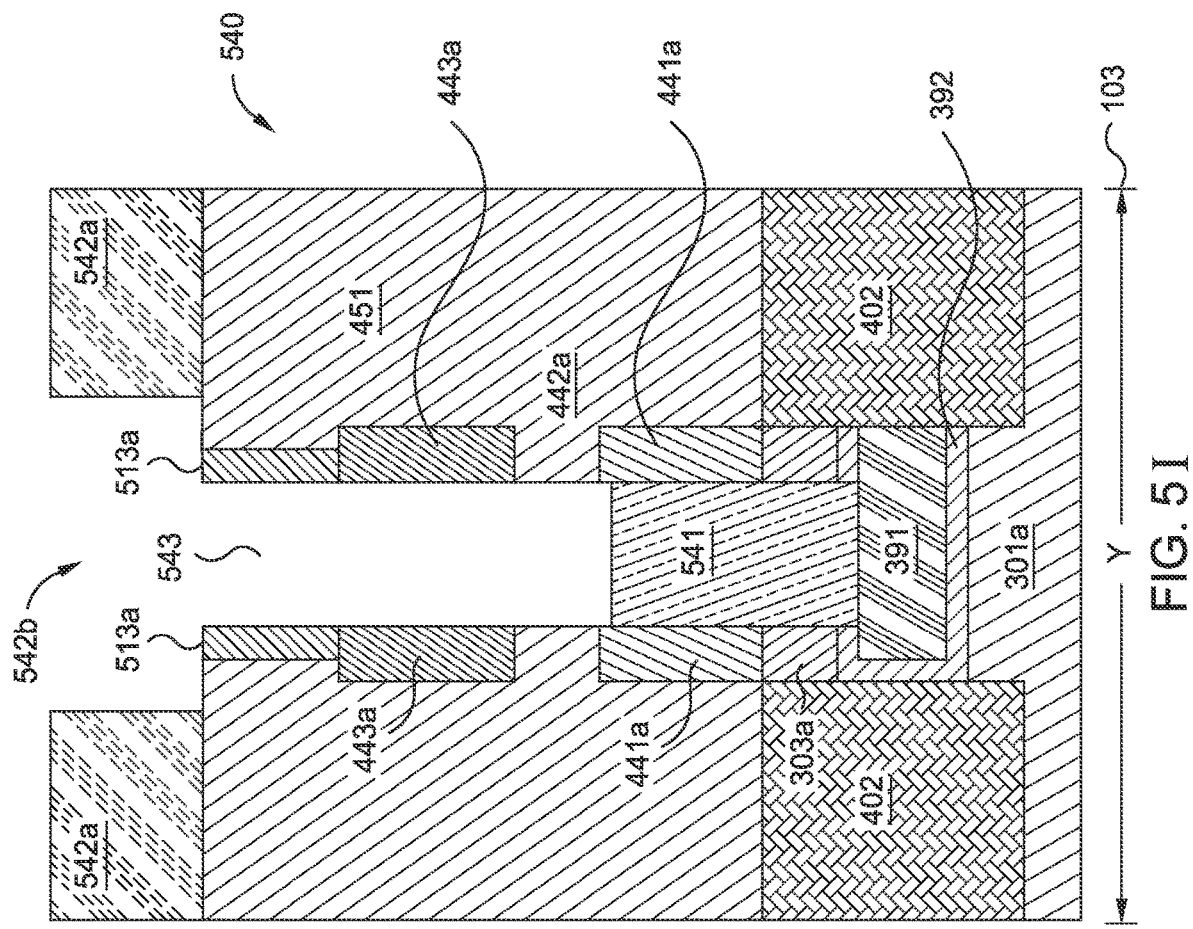

STACKED DEVICE WITH BURIED INTERCONNECT

BACKGROUND

The present invention relates to stacked field-effect transistor (stacked FET), in which at least one transistor is stacked at least over another transistor, and more specifically, to a design for providing effective contacts in the stacked FET devices without overly increasing the size of the devices.

Conventional approaches for providing contacts for bottom source/drain epitaxial regions of a stacked FET requires larger footprint of bottom device to extend beyond the size of top device, such that S/D contacts for bottom device can be formed without shorting to top device, which greatly increases the size and fabrication complexity as the device sizes increase.

SUMMARY

One embodiment of the present invention includes a stacked device. The stacked device includes a first device including a first source/drain epitaxy (S/D epi) region and a second device may include a second S/D epi region. The second device is positioned over the first device in the stacked device. The stacked device also includes a dielectric isolation layer between the first device and the second device, a buried metal line, and a buried contact formed through the first S/D epi region from the dielectric isolation layer to the buried metal line. The stacked device also includes a top contact formed through the second S/D epi region from the dielectric isolation layer to a top side of the stacked device.

According to one embodiment of the present invention, a method is provided. The method includes forming, in a stacked structure, a buried metal line, and forming a first source/drain epitaxy (S/D epi) region and a second S/D epi region, where the second S/D epi region is positioned over the first S/D epi region in the stacked structure. The method also includes forming a buried contact through the first S/D epi region, forming a dielectric isolation layer on a top surface of the first S/D epi region and the buried contact, and forming a top contact through the second S/D epi region from the dielectric isolation layer to a top side of the stacked structure.

One embodiment includes a stacked field-effect transistor (FET). The stacked FET includes a first device with a first source/drain epitaxy (S/D epi) region, and a second device with a second S/D epi region, where the second device is positioned over the first device in the stacked FET. The stacked FET also includes a dielectric isolation layer between the first device and the second device, a buried metal line, a buried contact formed through the first S/D epi region from the dielectric isolation layer to the buried metal line, a top contact formed through the second S/D epi region from the dielectric isolation layer to a top side of the stacked FET, and a wired connection from a top of the stacked FET to the buried metal line.

BRIEF DESCRIPTION OF THE DRAWINGS

FIGS. 4A-4M illustrate several views of the stacked device during fabrication according to the method described in relation to FIG. 2, according to embodiments of the present disclosure.

DETAILED DESCRIPTION

The present disclosure provides stacked field-effect transistors (FETs) layouts with a buried interconnect within the stacked devices and methods of fabrication of the devices and buried interconnect. The buried interconnect allows for efficient scaling of the stacked devices without extraneous wiring from a top of the device to each epitaxial region/device within the overall device.

Figure 1A:
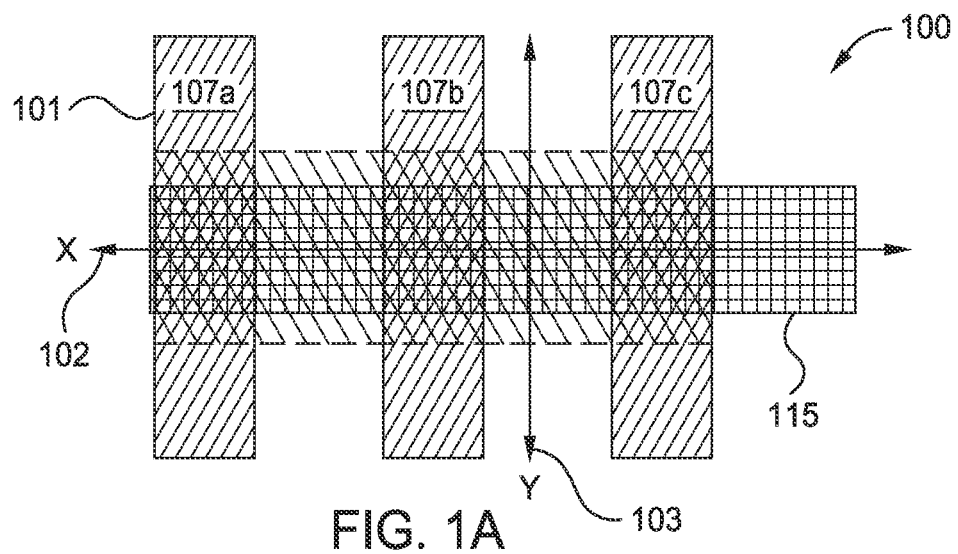
FIGS. 1A-C illustrate several views of the stacked device with a buried interconnect, according to embodiments of the present disclosure.
Figure 1B:
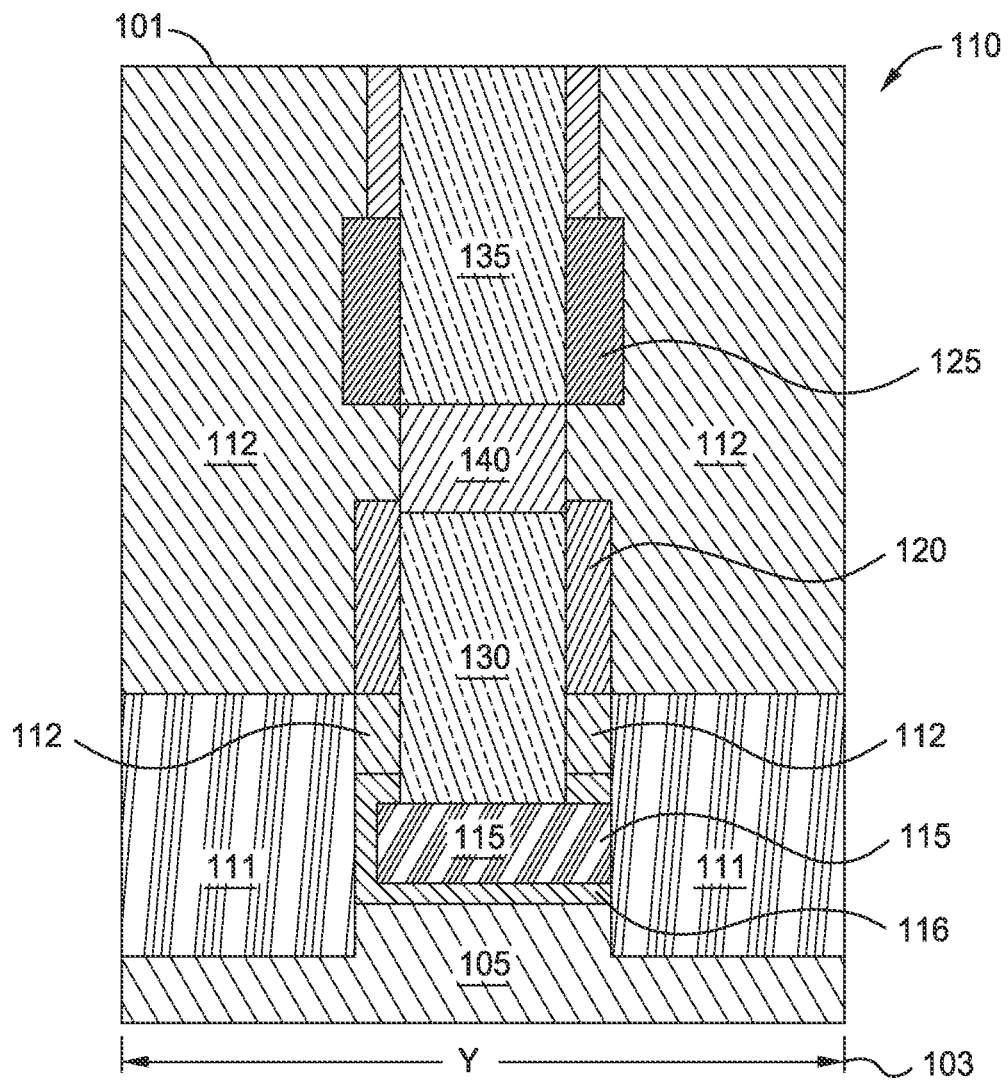
Figure 1C:
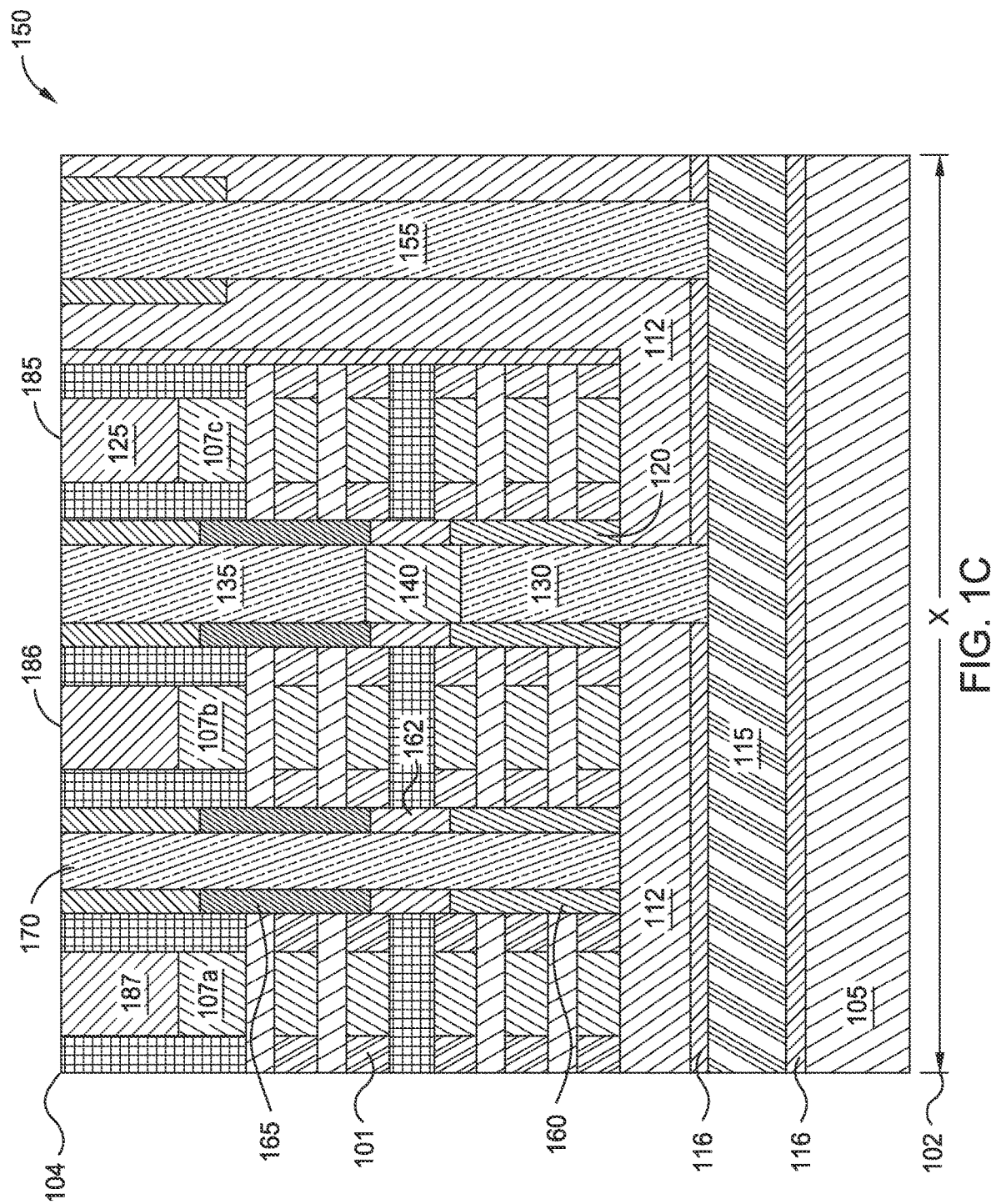

FIGS. 1A-C illustrate several views of the stacked device with a buried interconnect, according to embodiments of the present disclosure. FIG. 1A illustrates a top view 100 of device 101 where FIG. 1B illustrates a cross-section view 110 along Y-axis 103 and FIG. 1C illustrates cross-section view 150 along X-axis 102.

The device 101 includes a first device of the stacked device, which includes a first source/drain epitaxy (S/D epi) region 120, and a second device including a second S/D epi region 125. In some examples, the second device and second S/D epi region 125 is positioned over the first device and first S/D epi region 120 in the stacked device. The device 101 also includes a dielectric isolation layer 140 between the first device and the second device and a buried metal line 115. In some examples, the device 101 includes a buried contact 130 formed through the first S/D epi region 120 from the dielectric isolation layer 140 to the buried metal line 115. The device 101 also includes a top contact 135 formed through the second S/D epi region 125 from the dielectric isolation layer to a top side of the stacked device. In some examples, the device 101 includes a substrate 105, interlayer dielectric (ILD) material layer 112, and shallow trench isolation (STI) material 111.

In some examples, the first device and the first S/D epi region 120 is one of a p-type FET (PFET) device or an n type FET NFET device, and the second device S/D epi region 125 is also one of a PFET device or and NFET device, where the first device and second device are different (e.g., one is a PFET and one is an NFET). The device 101 may also include a wired connection or metal connection 155 from the top side of the stacked device to the buried metal line 115, where the metal connection provides a power signal to the buried metal line 115. The device 101 also includes a dielectric liner 116 formed on at least one side of the buried metal line 115, where the buried contact is formed through the dielectric liner.

In some examples, the device 101 may also include a third device with a third S/D epi region 160 and a fourth device with a fourth S/D epi region 165, where the fourth device is positioned over the third device in the stacked device. The device 101 may also include an intermediate layer 162 between the third device and the fourth device and a shared contact formed 170 through from the top side 104 of the stacked device through the fourth S/D epi region 165, the intermediate layer 162, and the third S/D epi region 160 which is not connected to the buried metal line.

In some examples, the device 101 also includes a plurality of high-k metal gates (HKMGs) such as HKMGs 107a-107c with self-aligned contact (SAC) caps, such as SAC caps 185-187, where the first device and first S/D epi region 120 and the second device and second S/D epi region 125 are positioned between a first HKMG, HKMG 107c, and a second HKMG, HKMG 107b. Additional details of the various other components of the device 101 are discussed in relation to the methods for forming the device as described in relation to FIGS. 2-5N FIG. 2 is a flowchart of a method 200 for fabrication of a stacked device with a buried interconnect, according to embodiments of the present disclosure. Method 200 may be understood in conjunction with FIGS. 3A-3I, 4A-4M, and 5A-5L which illustrate several views of the stacked device during fabrication according to the method 200, according to embodiments of the present disclosure. The FIGS. 3A-3I, 4A-B, 4D, 4F, 4H, 4J, 5A, 5C, 5E, 5G, 5I, and 5K illustrate cross-section views of the stacked device in various phases of fabrication along the Y axis shown in FIG. 1A. The FIGS. 4C, 4E, 4G, 4I, 4K, 4L, 4M, 5B, 5D, 5F, 5H, 5J, and 5L illustrate cross-section views of the stacked device in various stages of fabrication along the X-axis shown in FIG. 1A.

As will be appreciated, because some of the Figures depict in-process fabrication of the interconnect layer, a given figure may include temporary elements that are not included in the final device or have shapes and size of elements that differ from those in the final layout. Similarly, various elements may be absent at various stages of fabrication, and are therefore absent in view that would otherwise include those elements at a later time during fabrication. Additionally, although shown with various sizes, shapes, and quantities of components in the Figures, the elements are provided as non-limiting examples to illustrate potential embodiments of interconnect layers, which may include different sizes, shapes, and quantities of components from those illustrated in the Figures. Furthermore, various elements may be intentionally omitted or resized to better show certain relationships between the other elements.

Method 200 begins at block 202 where a fabricator forms, in a stacked structure, a buried metal line. For example, the fabricator forms a buried metal similar to the buried metal line 115 as described in FIGS. 1A-C. In some examples, the process for forming the buried metal line includes the fabrication steps shown in FIGS. 3A-3I For example, at step 300 in FIG. 3A the fabricator forms a starting substrate base structure 305 for the stacked structure. The substrate base may include a silicon (Si) substrate layer such as layer 301, silicon-germanium (SiGe) layers such as layer 302 and layer 304, and a Silicon dioxide (SiO2). In some examples, the fabricator forms or grows each layer in an order from layer 301, layer 302, layer 303, to layer 304. In some examples, the layers 301, 302, and part of layer 303 are a first wafer and another part of the layer 303 and the layer 304 are a second wafer flip and attached to the first wafer. In some examples, the step 300 is a first step in a stacked FET fabrication process as described herein, where the substrate base provides a base for other layers/devices on which to be stacked.

Figure 3A:
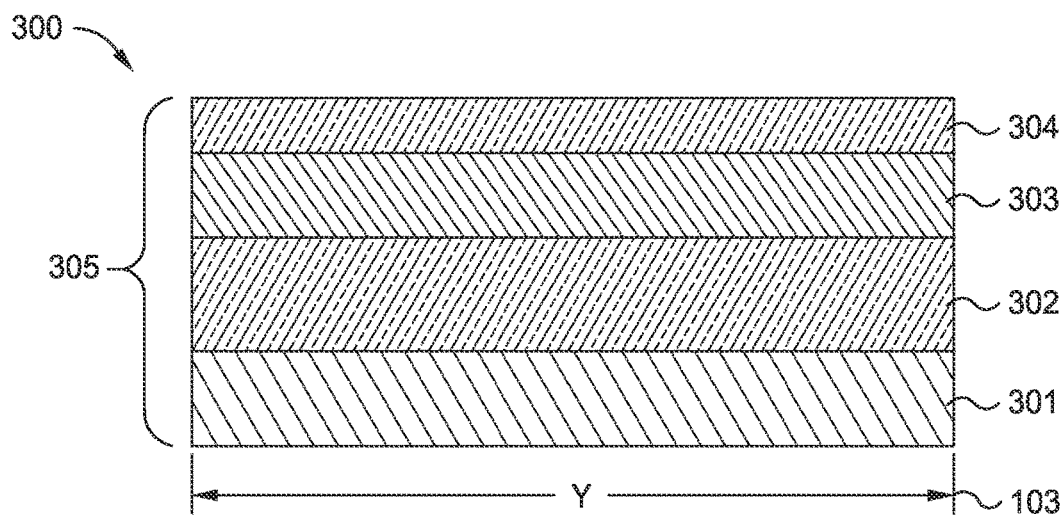
FIGS. 3A-3I illustrate several views of the stacked device during fabrication according to the method described in relation to FIG. 2, according to embodiments of the present disclosure.
Figure 3B:
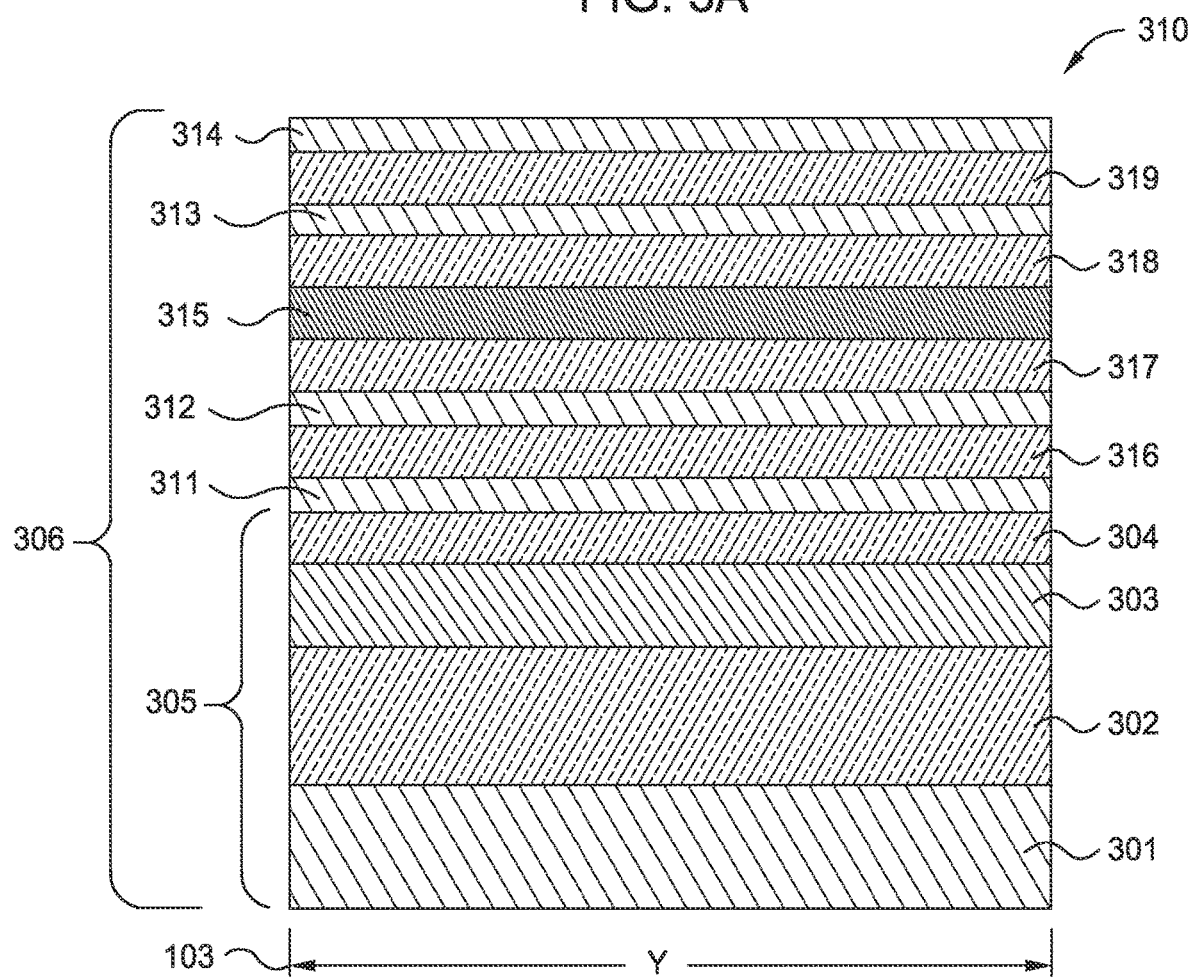

For example, at step 310 in FIG. 3B, the fabricator forms, using the starting substrate base, a layer stack by adding additional layers to the substrate base structure 305. For example, additional wafers and other layers may be stacked and or grown on the substrate base structure 305 to form a layer stack 306. The layer stack 306 includes layers 311-319. In some examples, layer 311, layer 312, layer 313 and layer 314 are silicon (Si) layers. In some examples, layer 315 is a SiGe layer with a high Ge percentage above 50%, such as SiGe60. The layers 316, 317, 318, and 319 may include SiGe layers with a low Ge percentage, such as SiGe30. In some examples, the layer stack 306 is a stacked FET stack used by the fabricator in further processes for forming the stacked device.

Figure 3C:
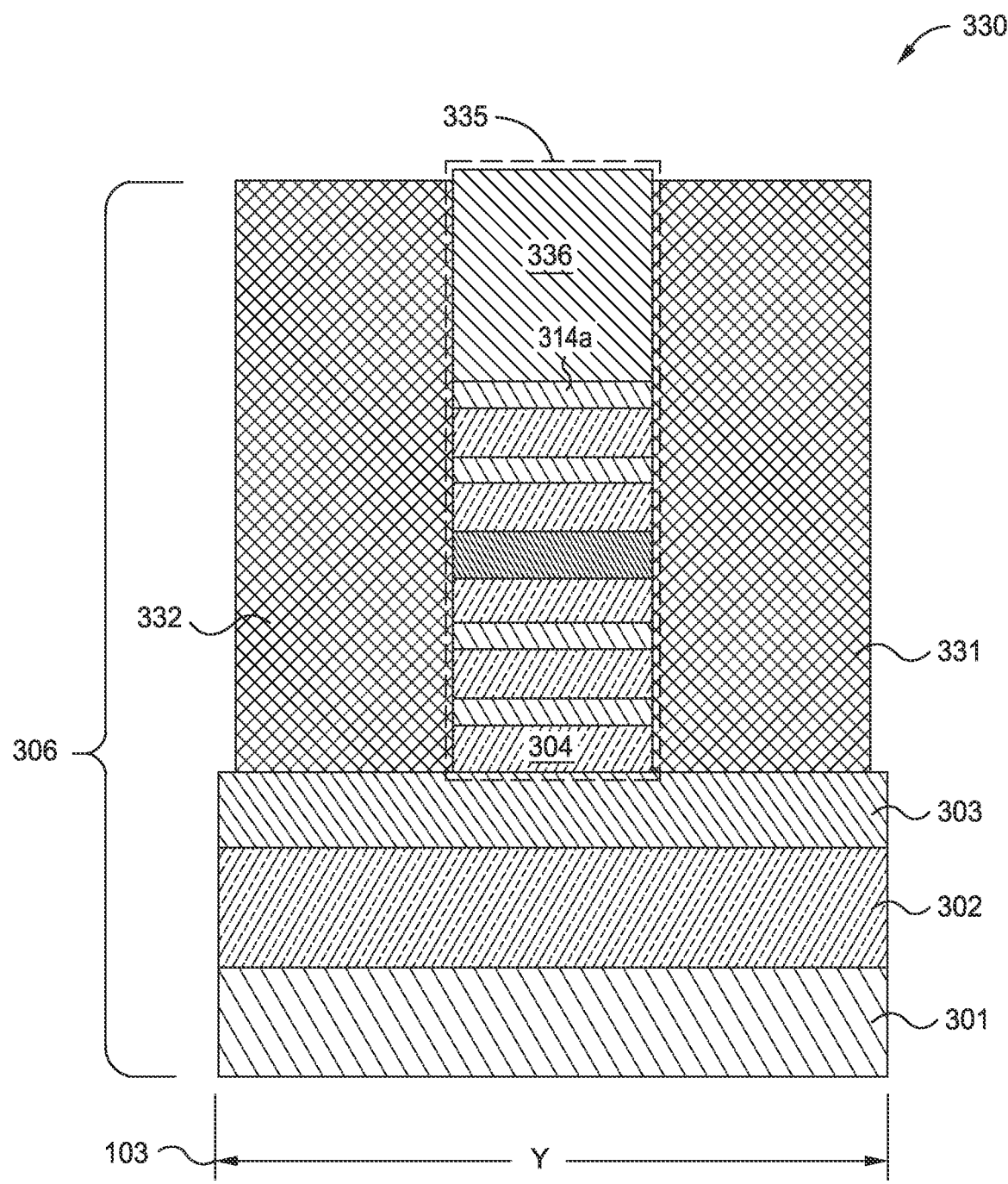

At step 330 in FIG. 3C, the fabricator patterns the layer stack into a structured layer stack. For example, the fabricator applies a hard mask (HM), such as HM 336 over a portion of the layer stack 306. The hard mask prevents a portion of the layer stack 306 from being removed in the patterning process. In some examples, the fabricator removes portion 331 and portion 332 from the layer stack 306 to form the structured layer stack 335 from the layers 304-319. In some examples, the portions 331 and 332 are removed from the layer 314a down through to layer 303 via patterning, etching, or other appropriate layer removal process. The structured layer stack 335 includes remaining parts of the layers 304 through 314 (shown in FIG. 3C as parts 304a and 314a for ease of illustration, but includes corresponding parts for the layers 311-319).

Figure 3D:
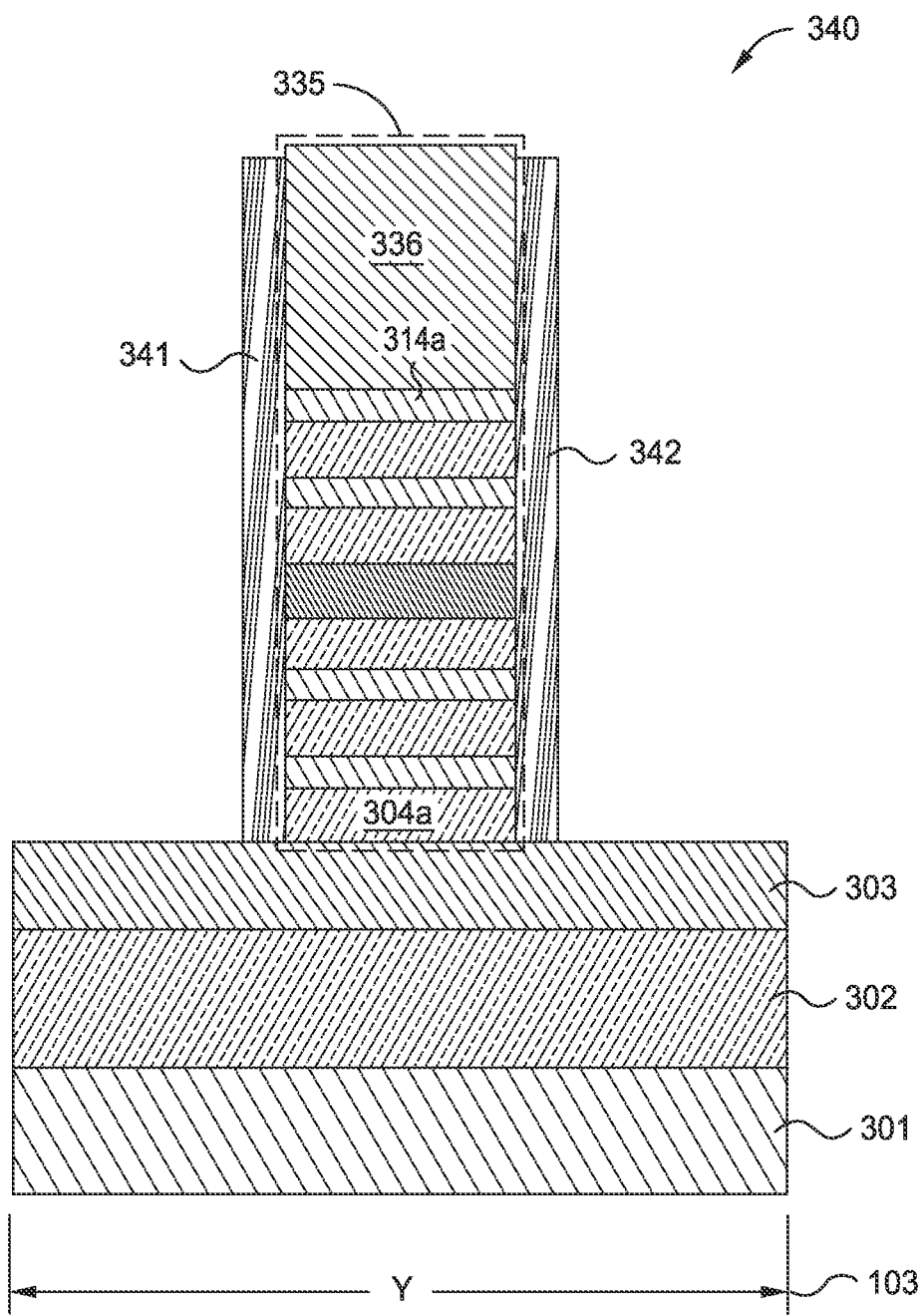

At step 340 in FIG. 3D, the fabricator forms a protective sidewall spacer on at least two sides of the structure layer stack. For example, the fabricator forms a protective spacer 341 on a first side of the structured layer stack 335 and protective spacer 342 on a second side of the structured layer stack 335. In some examples, the protective sidewall spacers provide protection against etching to parts of the layers 303, 302, and 301 under the protective sidewalls as well as the structured layer stack 335.

Figure 3E:
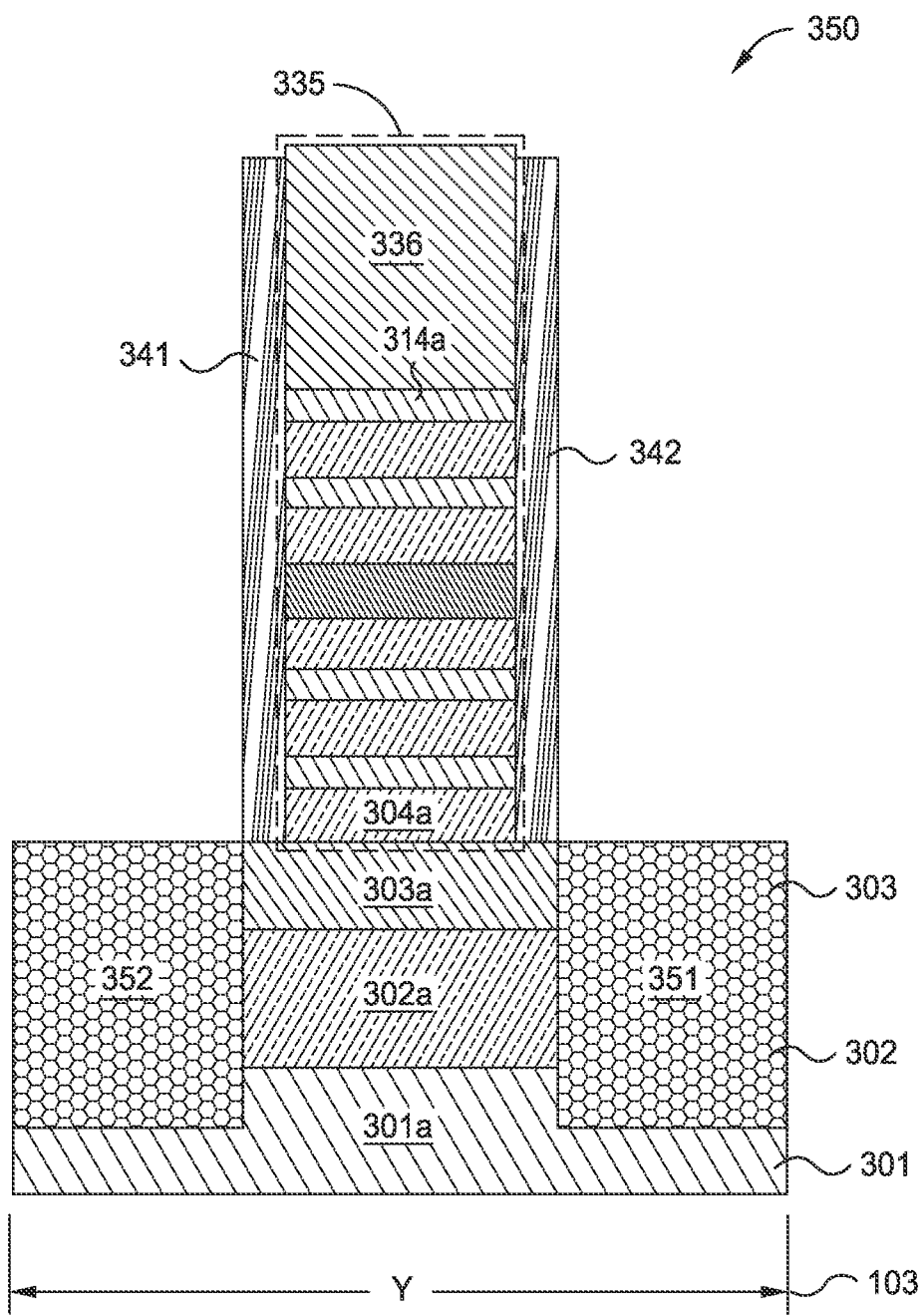

At step 350 in FIG. 3E, the fabricator further etches the structured layer stack. For example, the fabricator etches (e.g., using reactive-ion etching (RIE)) or otherwise removes portions 351 and 352 of the layers 301, 302, and 303. In some examples, the fabricator forms the structured layer stack 355 by removing the portions 351 and 352. Once the structured layer stack 355 is formed, the fabricator forms the buried metal line in the structured layer stack as discussed in FIGS. 3F-3I.

Figure 3F:
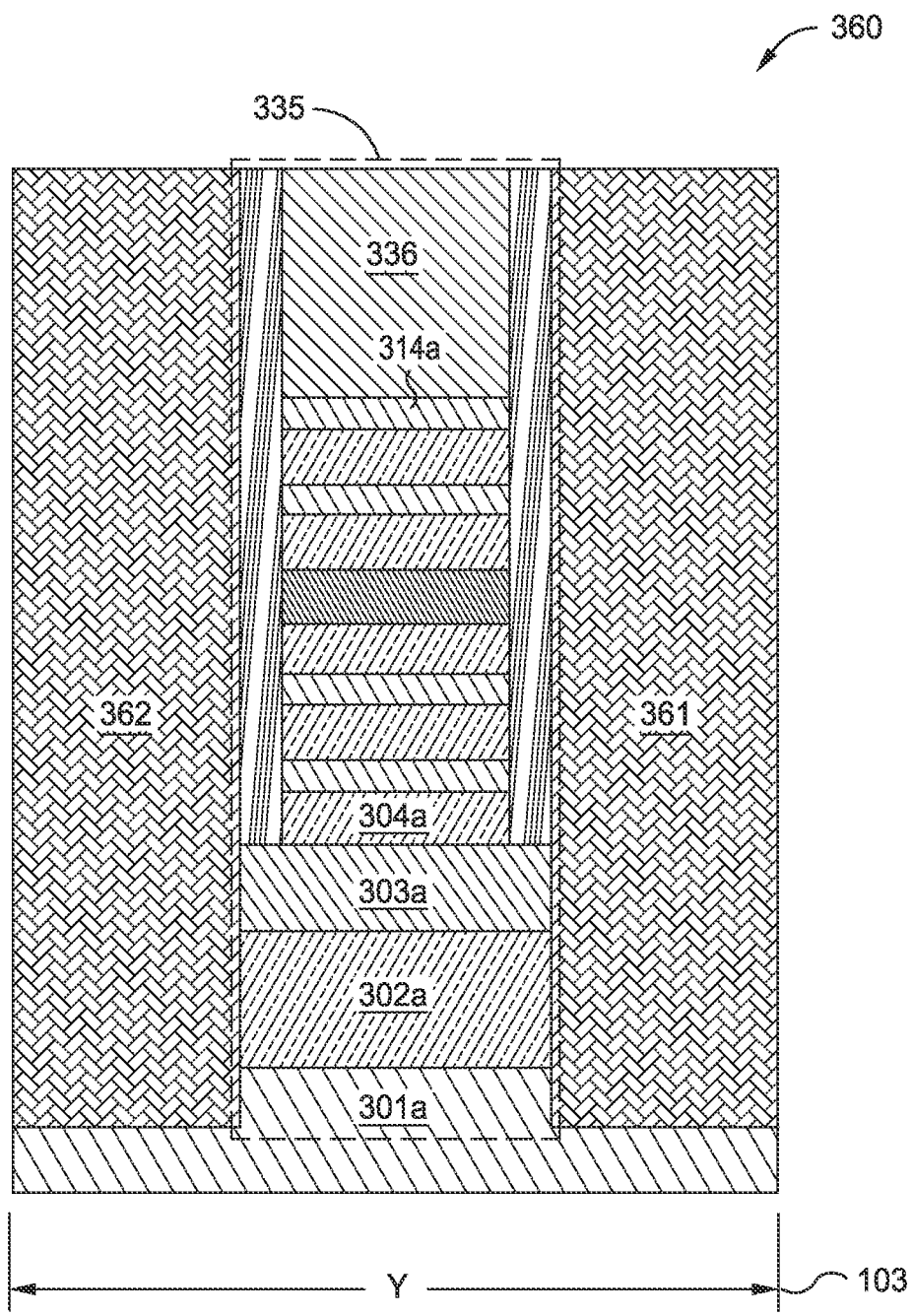

At step 360 in FIG. 3F, the fabricator provides an inter-layer dielectric (ILD) layer around the structured layer stack 355. For example, the fabricator forms the ILD layers 361 and 362 on each side of the structured layer stack 355. In some examples, the fabricator also utilizes a chemical mechanical polishing (CMP) process to polish a top side of the structured layer stack 355 and the ILD layers 361 and 362.

Figure 3G:
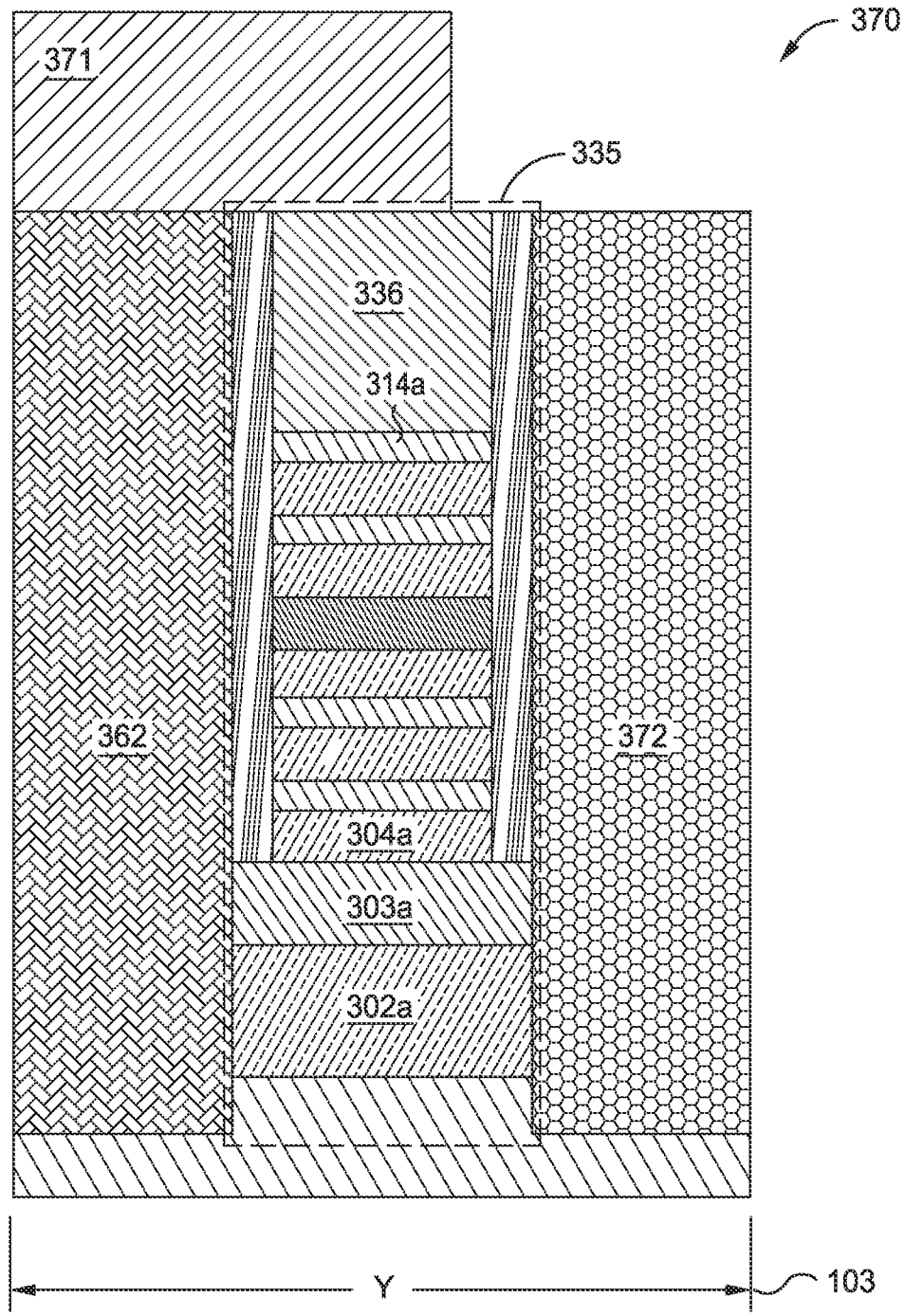
Figure 3H:
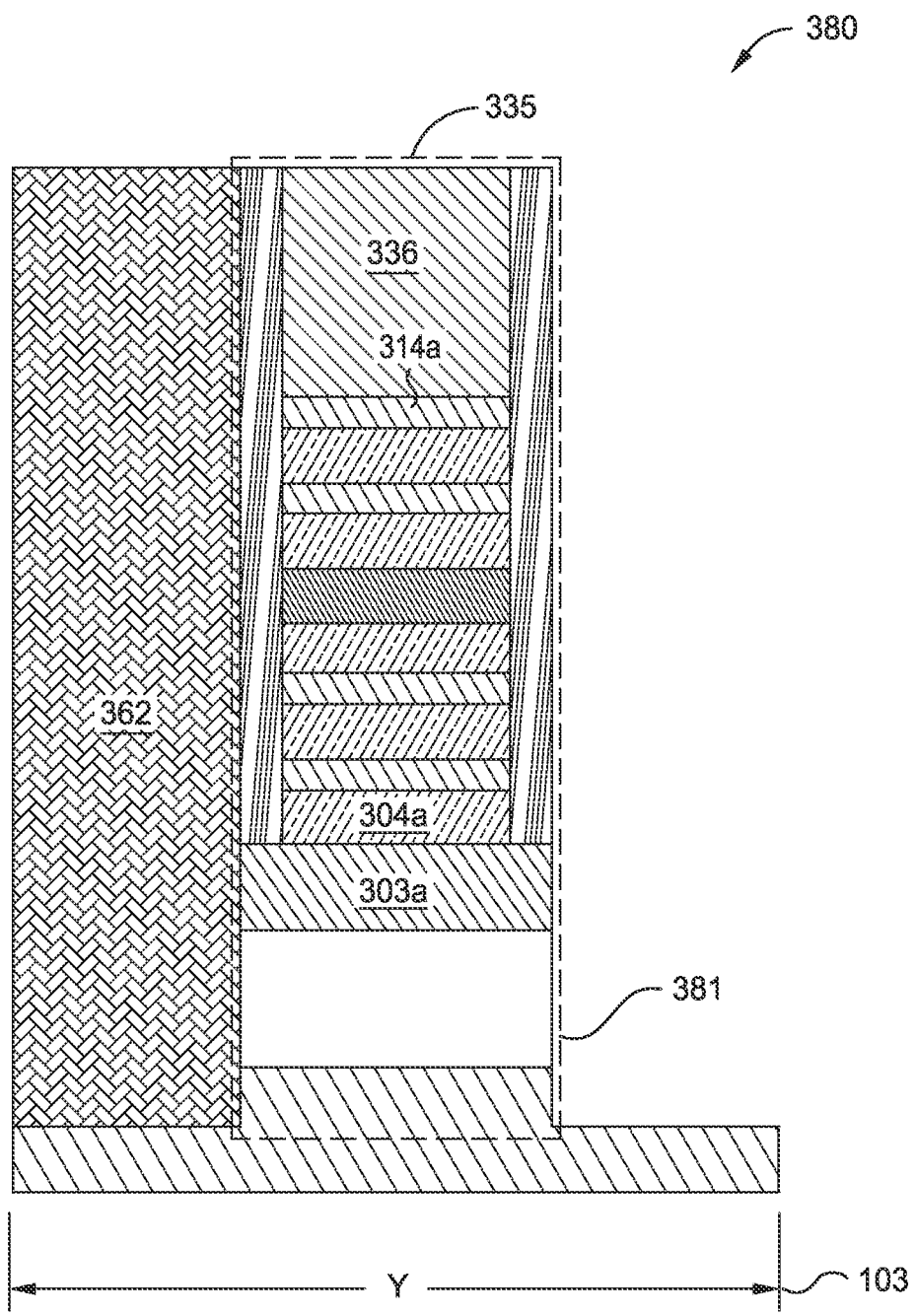

At step 370 in FIG. 3G, the fabricator applies a mask 371 over the structured layer stack 355 and the ILD layer 362. The fabricator also removes the ILD layer 361 (i.e., portion 372). In some examples, step 370 opens access to lower layers of the structured layer stack 355 to provide a buried metal line. At step 380 in FIG. 3H, the fabricator removes portion 302a (e.g., removes the SiGe portion remaining from the layer 302 in the structured layer stack 355) to create void 381 in the structured layer stack 355.

Figure 2:
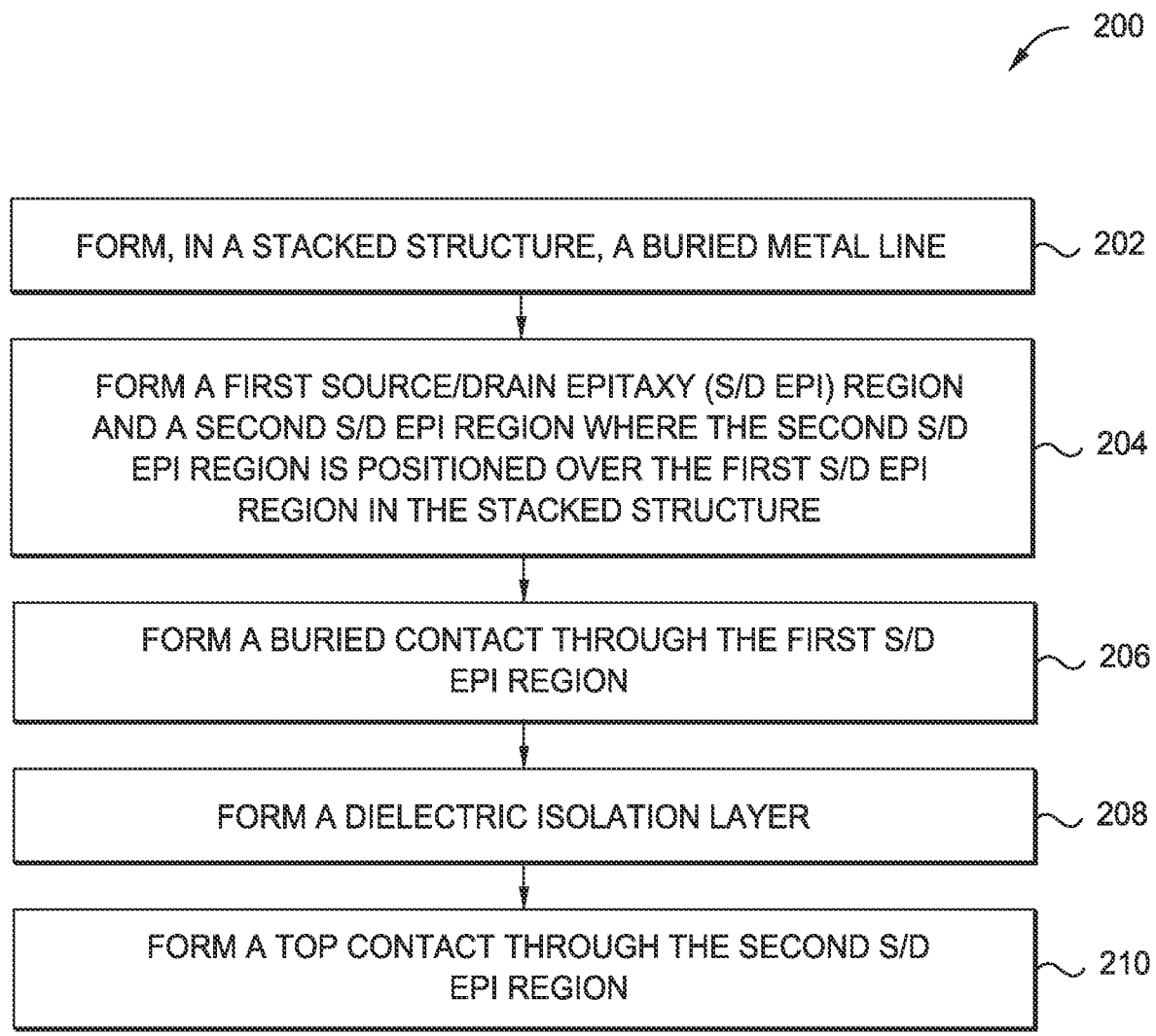
FIG. 2 is a flowchart of a method for fabrication of a stacked device with a buried interconnect, according to embodiments of the present disclosure.
Figure 3I:
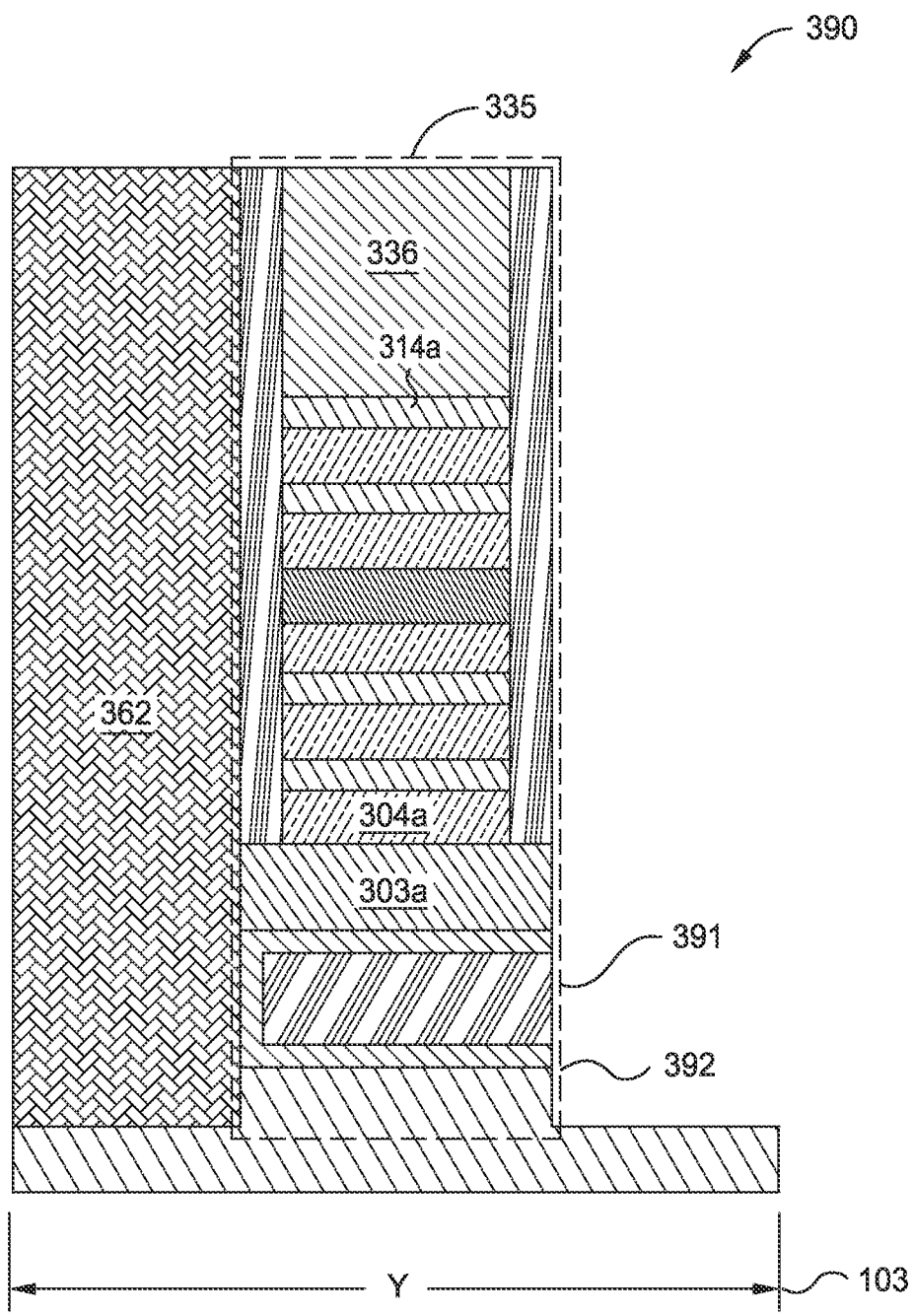

At step 390 in FIG. 3I, the fabricator forms the liner 392 and buried metal line 391. In some examples, the liner 392 is a dielectric liner between the buried metal line 391 and the layer 301. The buried metal line 391 includes metallic or other material that provides an electrically conductive connection. In some examples, the fabricator further process the structured layer stack 355 and the ILD layer 361, etc. using RIE or other processes to prepare the layers for further processing as discussed in FIG. 2 and FIGS. 4A-M.

Returning back to method 200 of FIG. 2, at block 204 the fabricator forms a first source/drain epitaxy (S/D epi) region and a second S/D epi region where the second S/D epi region is positioned over the first S/D epi region in the stacked structure. For example, the fabricator forms the S/D epi regions 120 and 125 as described in FIGS. 1B-C. In some examples, the process for forming the S/D epi regions includes the fabrication steps shown in FIGS. 4A-M.

FIGS. 4A-4M illustrate several views of the stacked device during fabrication according to the method described in relation to FIG. 2, according to embodiments of the present disclosure. For example, at step 400 the fabricator removes the HM 336 in FIG. 3I as well as the liners and protective spacers 341 and 342, and depositing additional ILD layer and recessing the ILD layer 362 using etching and other removal processes to form the structure 401. The recessed ILD layer 362 forms a STI layer 402. At step 410 in FIGS. 4B and 4C, the fabricator forms a plurality of gate structures on the stacked structure. For example, the fabricator forms a plurality of dummy gates 411a-c on the structure 401. The dummy gates may also include associated masks such as HM 412a-c. At step 420 in FIGS. 4D and 4E, the fabricator removes the SiGe layer, e.g., portion 315a to form the void 425 in the structure 401.

Figure 4A:
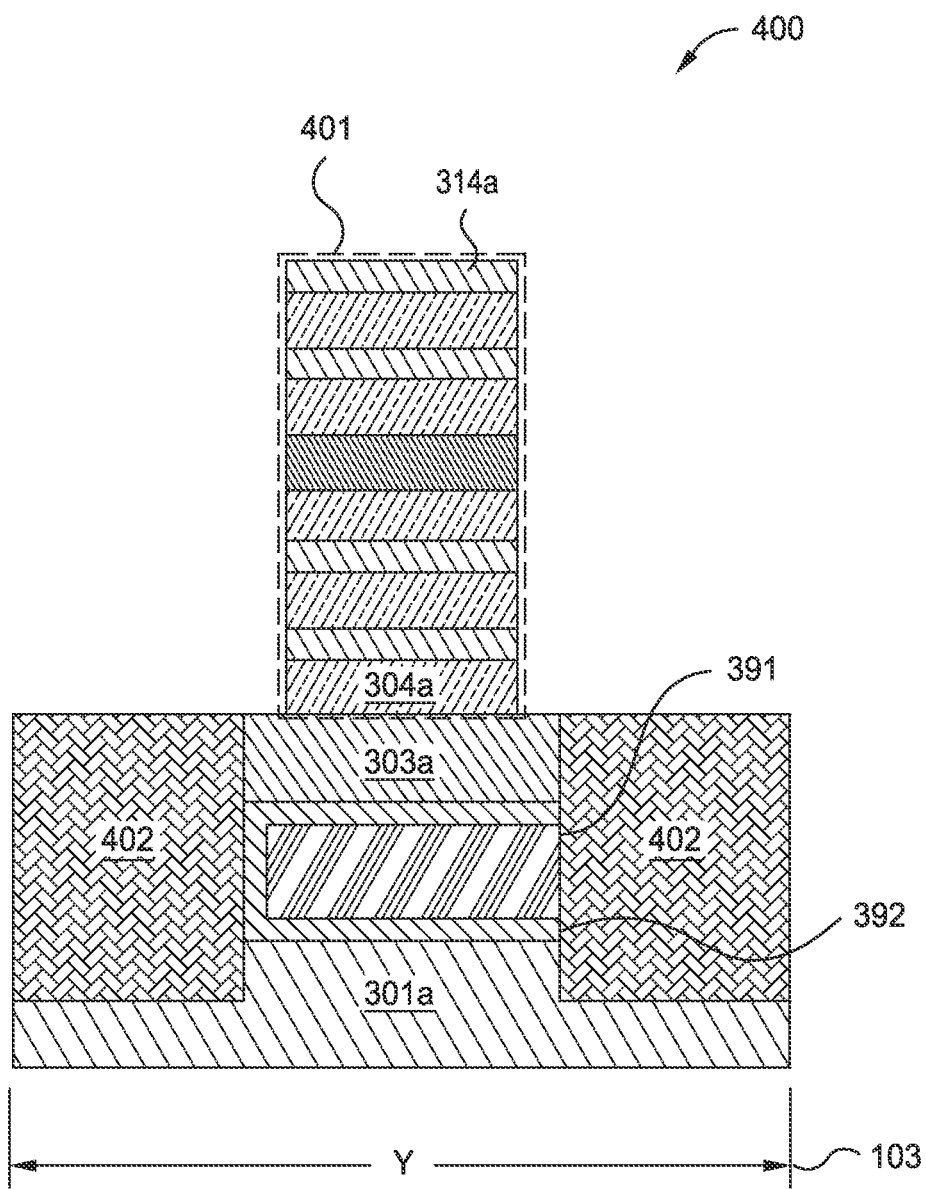
Figure 4B:
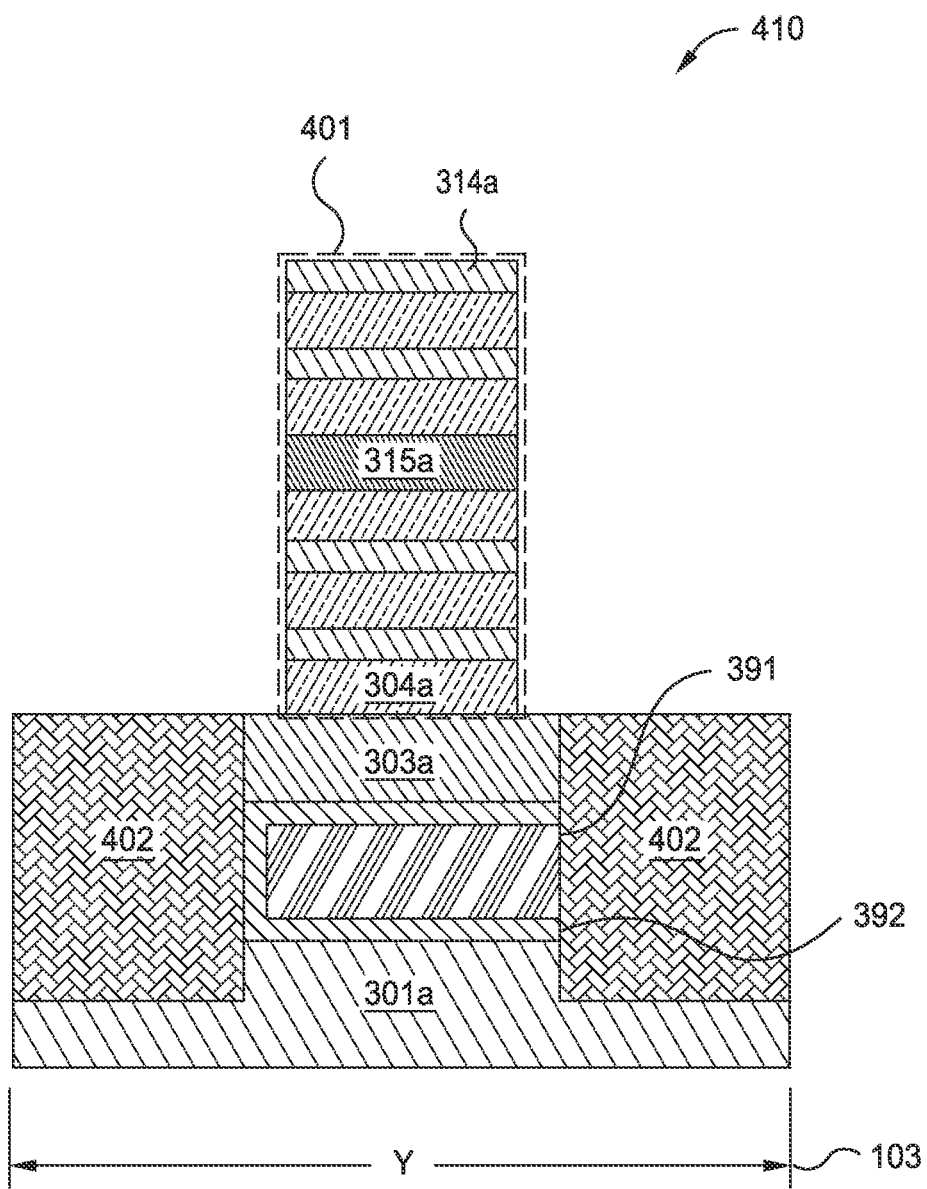
Figure 4C:
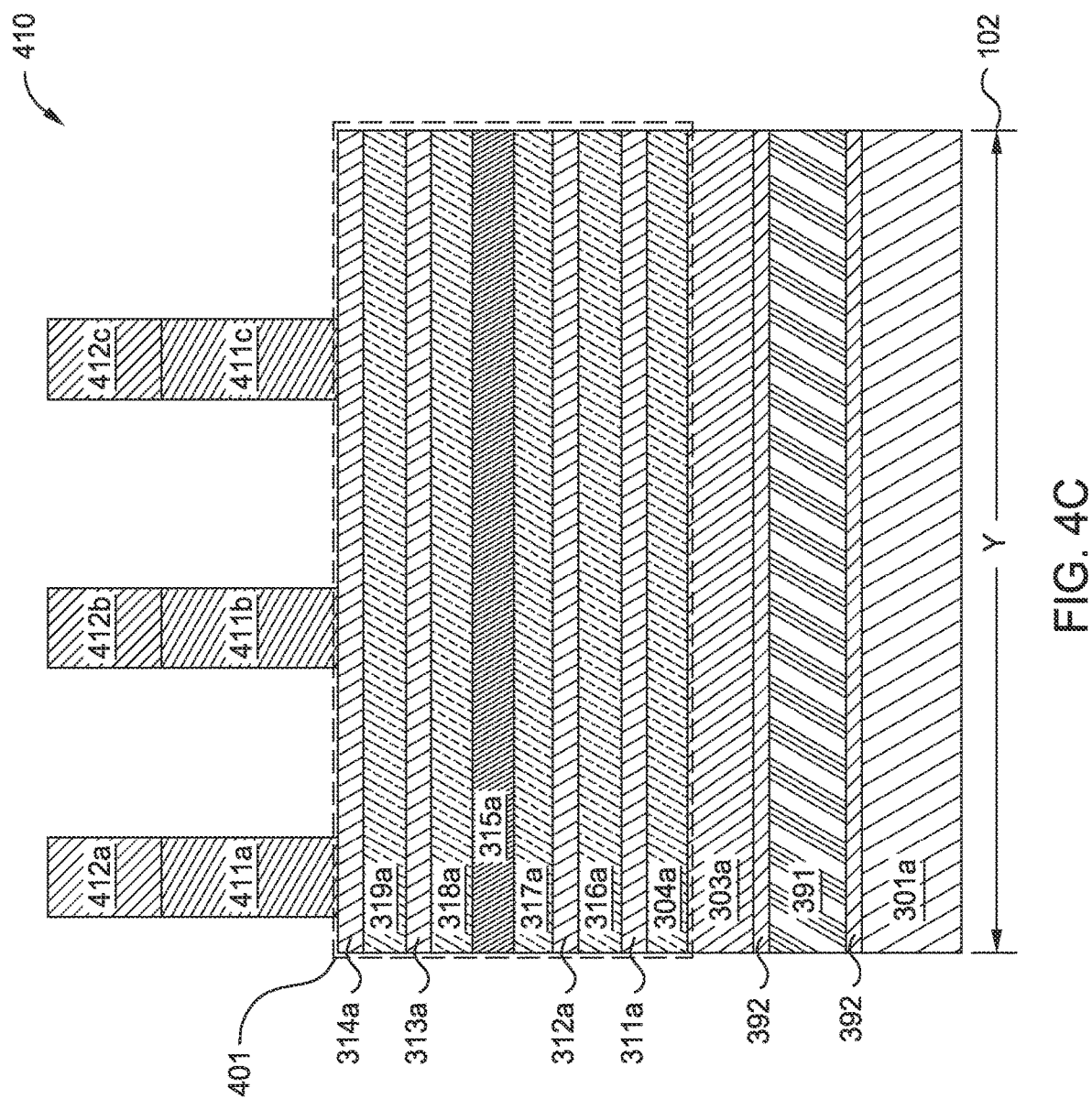
Figure 4D:
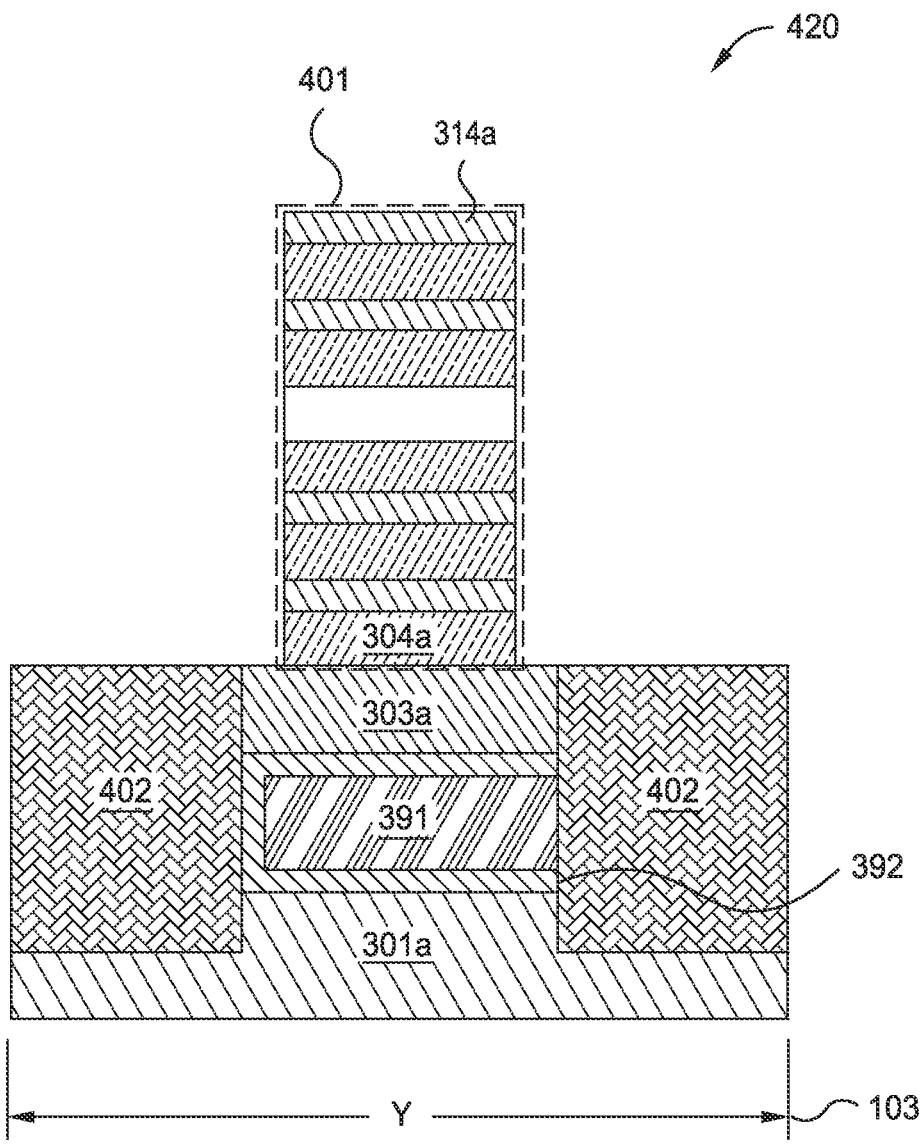
Figure 4F:
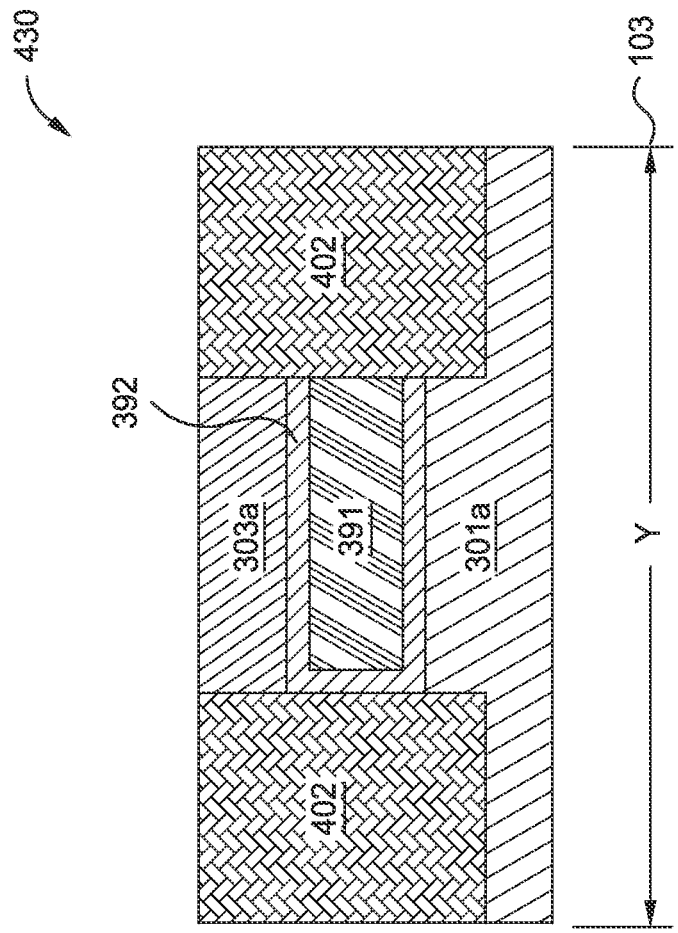
Figure 4G:
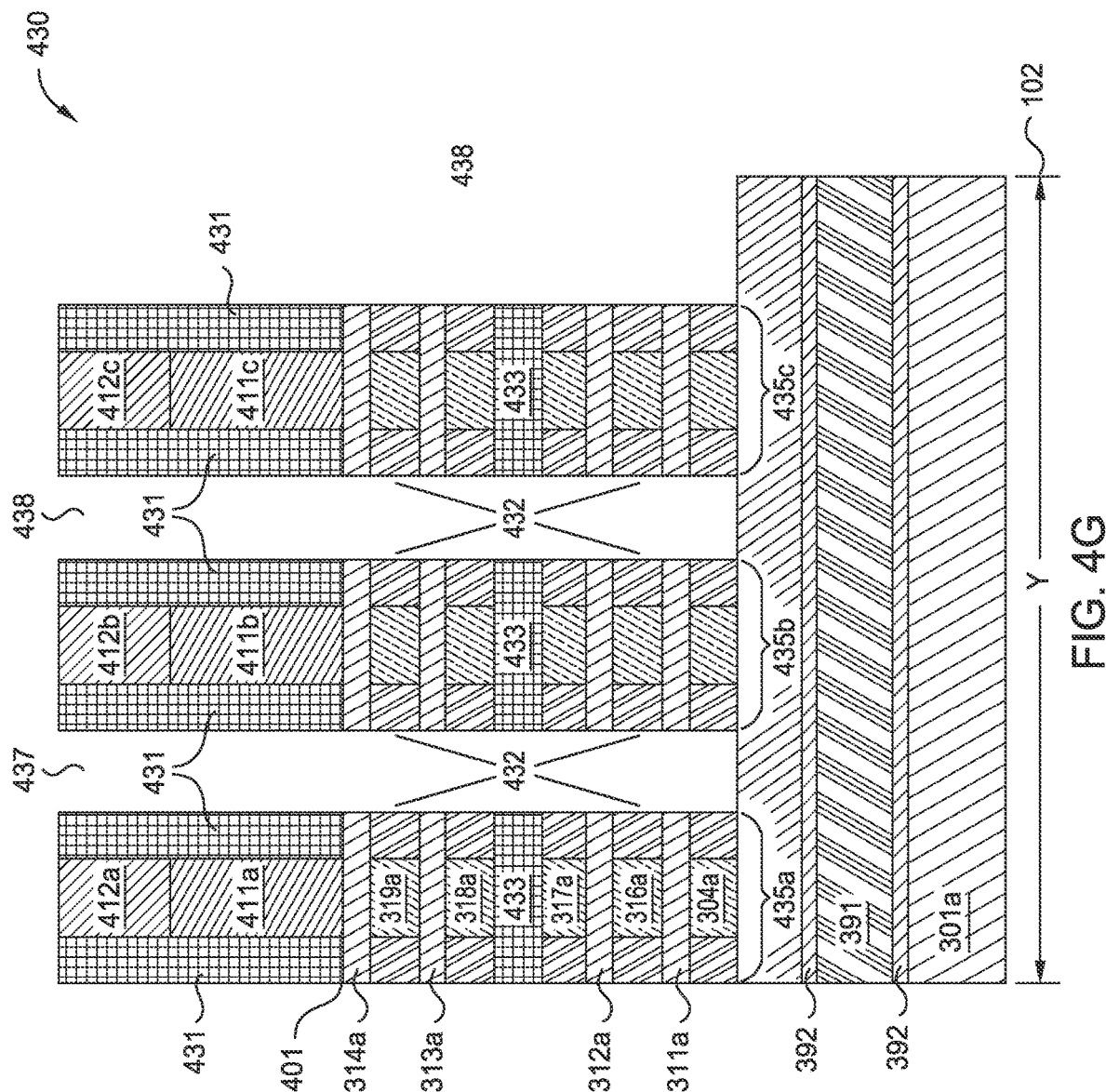
Figure 4I:
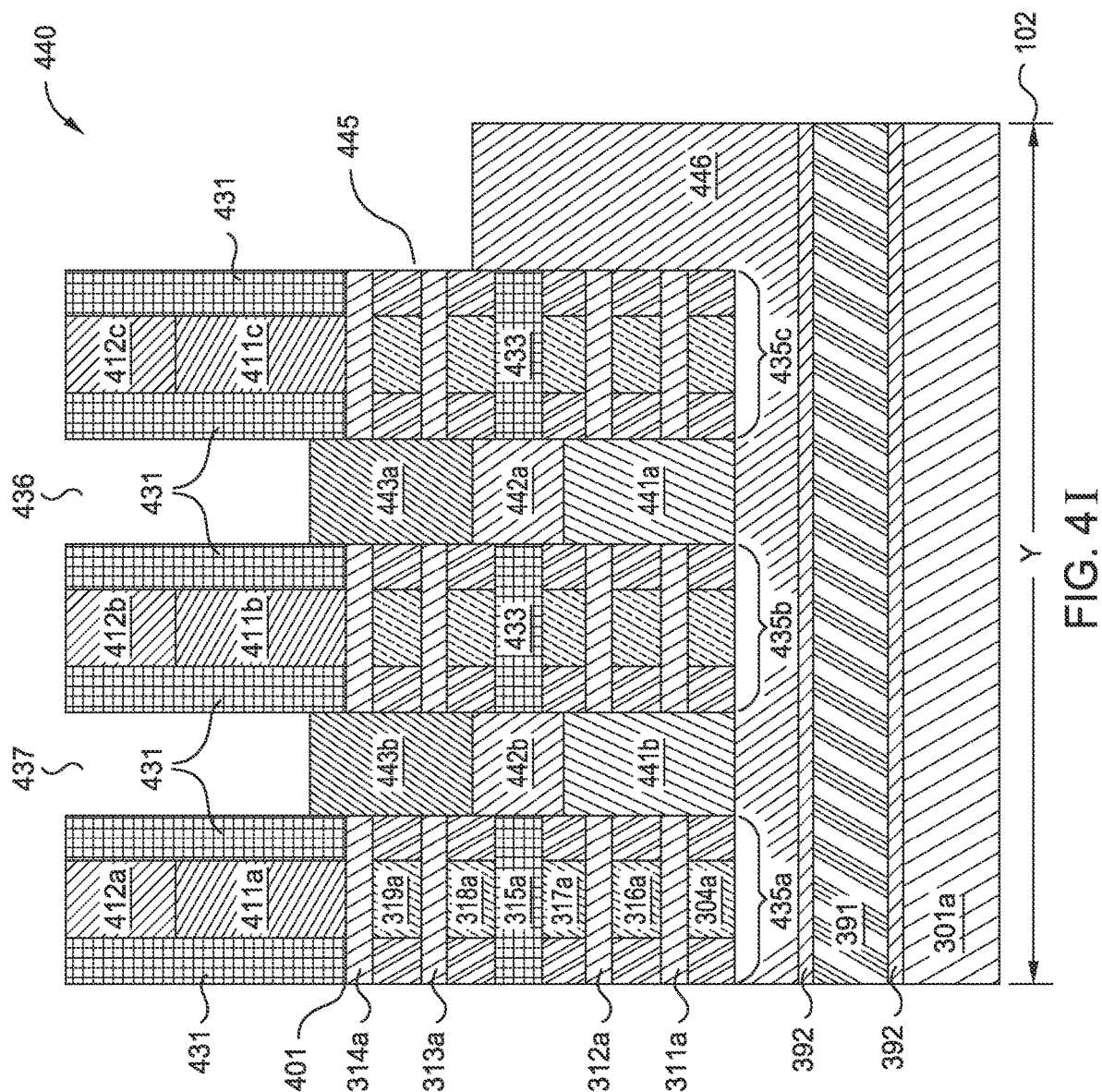

At step 430 in FIGS. 4F and 4G, the fabricator first forms the spacers 431 on sidewalls of the dummy gates 411a-c, HM 412a-c and void 425. The fabricator also removes portions of the layers 304a-314a using an anisotropic etch process where the gate HM and spacer serve as a mask to form a plurality of spaces between the plurality of gate structures. For example, recess 436, recess 437, and space 438 are formed beside/between structures 435a, 435b, and 435c. Once the spaces are formed, the exposed SiGe30 layers 304, 316, 317, 318 and 319 are indented and followed by inner spacer 432 formation. Additionally, the structures 435a-435c include spacer 433 formed in the void 425.

At step 440 in FIGS. 4 H and 4I, the fabricator grows the first S/D epi region in a first space between a first gate and a second gate of the plurality of gate structures. For example, the fabricator grows region 441a in the recess 436 between structures 436b and 435c. In some examples, the region 441a is a PFET or p-type region. In another example, the region 441a is a NFET or n-type region.

Additionally, the fabricator forms a first dielectric layer on a top surface of the first S/D epi region. For example, the fabricator forms the layer 442a in the recess 436. The fabricator also grows the second S/D epi region in the first space on a top surface of the first dielectric layer. For example, the fabricator grows the region 443a in the recess 436 on the layer 442a. In some examples, the layer 442a provides isolation between the regions 441a and 443a. In some examples, the region 443a is a PFET or p-type region (e.g., in an example where the region 441a is a NFET). In another example, the region 443a is a NFET or n-type region (e.g., in an example where the region 441a is a PFET).

In some examples, at step 440, the fabricator also forms the region 441b, layer 442b, and region 443b in the recess 437 to form multiple S/D regions/devices between the gate structures. Additionally, the fabricator may form a SiN liner 445 on a sidewall of the structure 435c and ILD layer 446 in the space 438. In some examples, the SiN liner 445 is an unremoved SiN liner during top and bottom S/D epi growth, since the line is not active region and all SiN liner deposited at this location is not removed. The dielectric 442a, 442b and 446 may also be formed together by overfilling the dielectric material, such as SiO2, followed by planarization and recess processes.

Figure 4J:
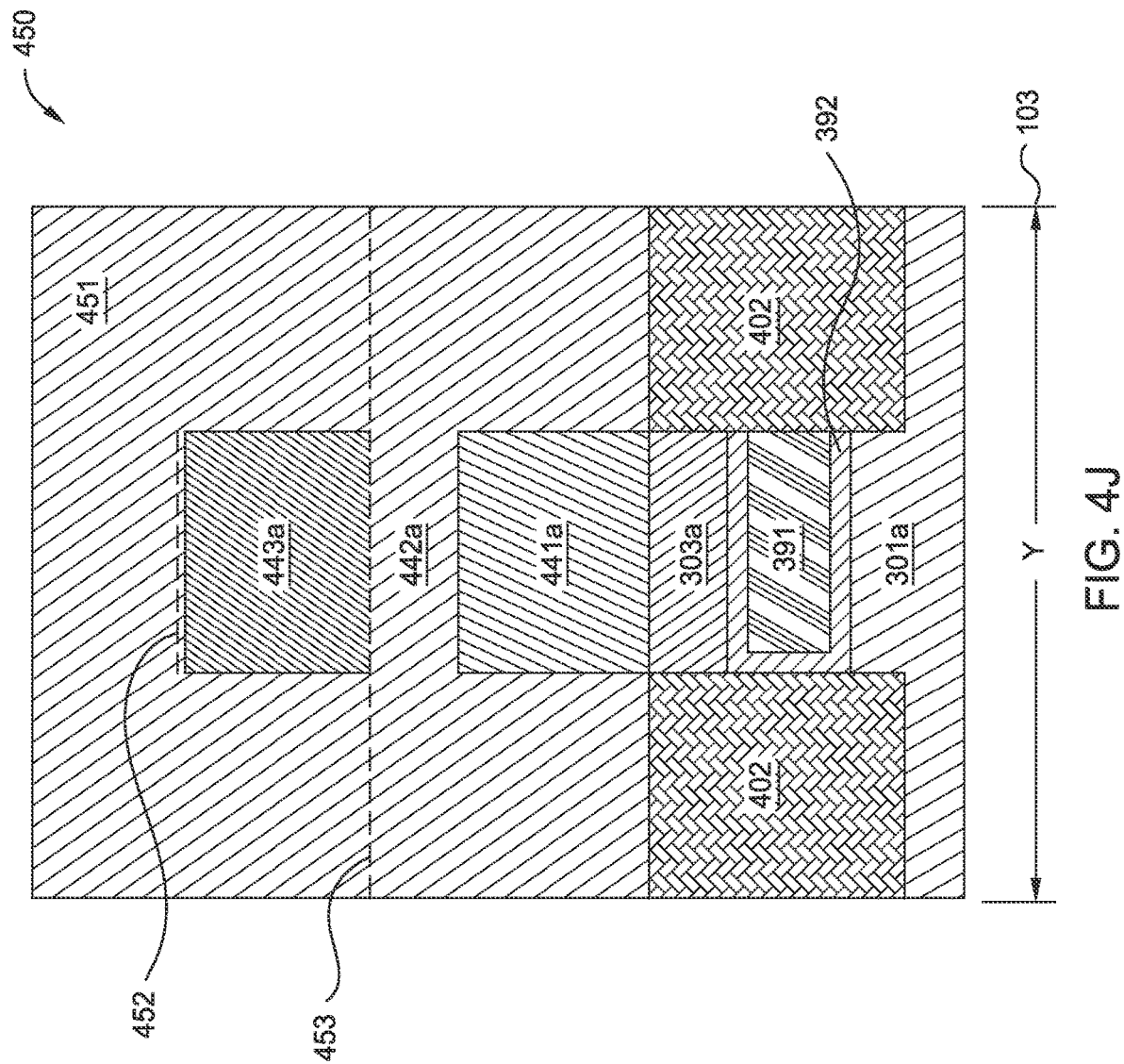
Figure 4K:
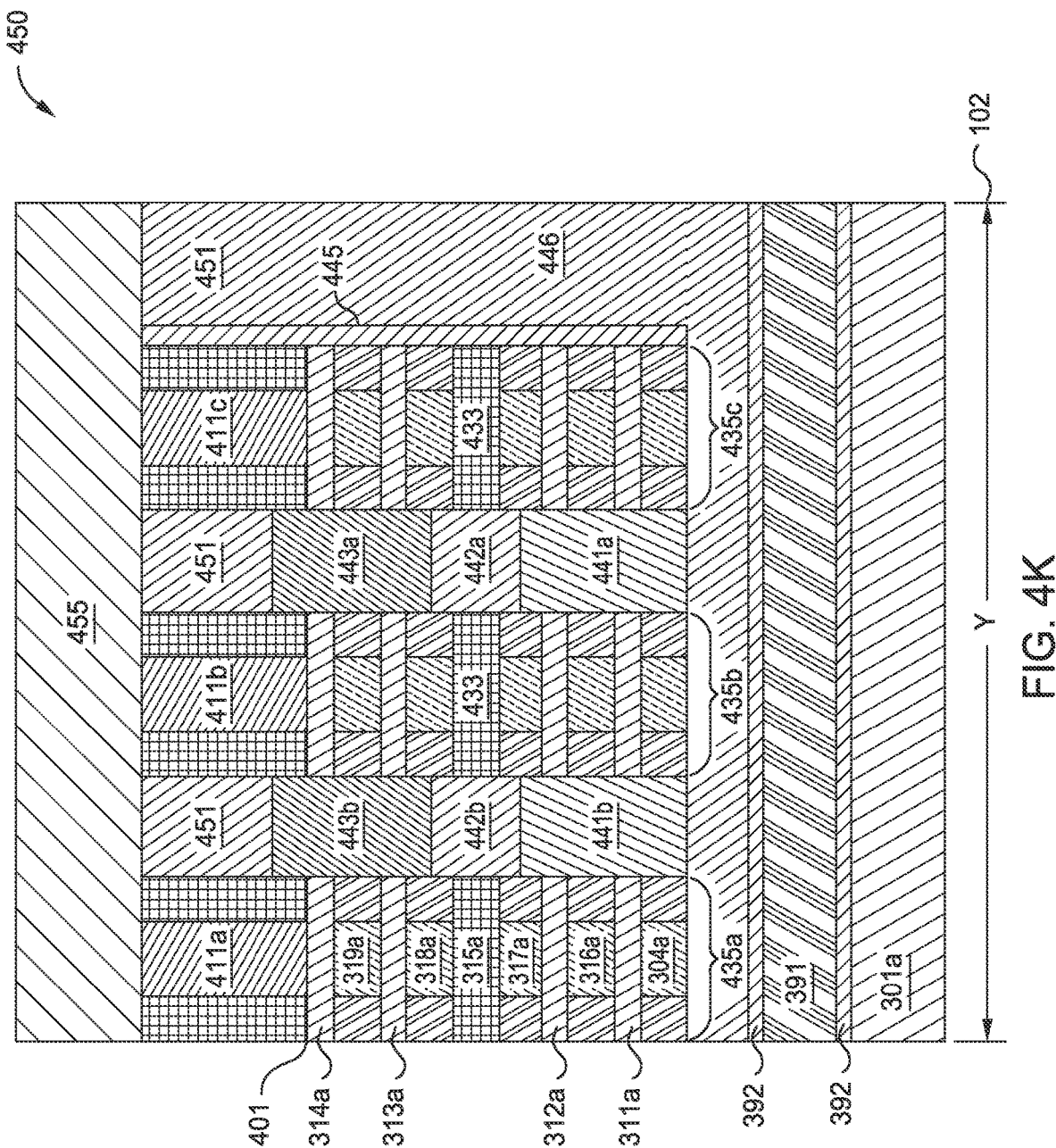
Figure 4L:
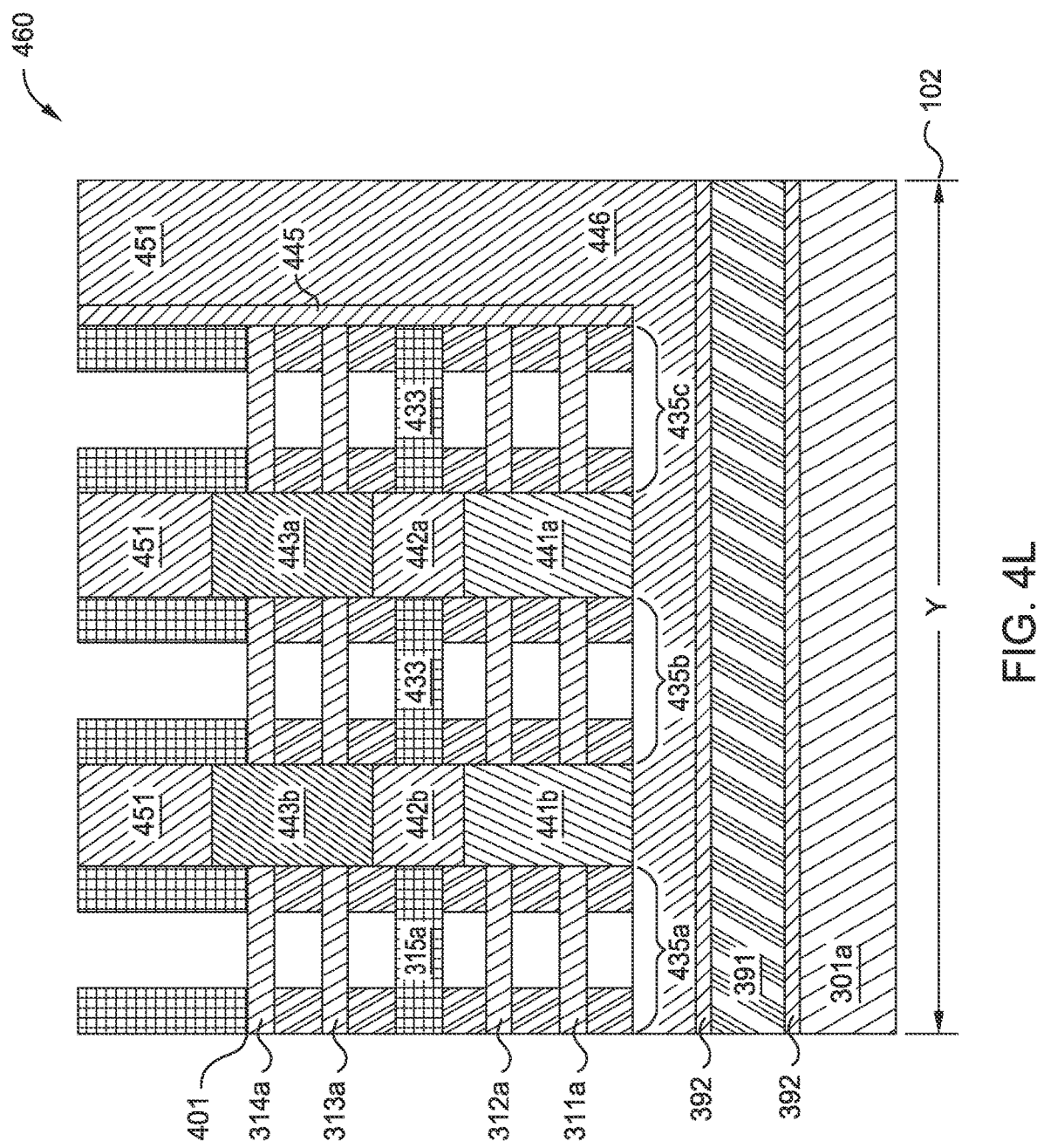
Figure 4M:
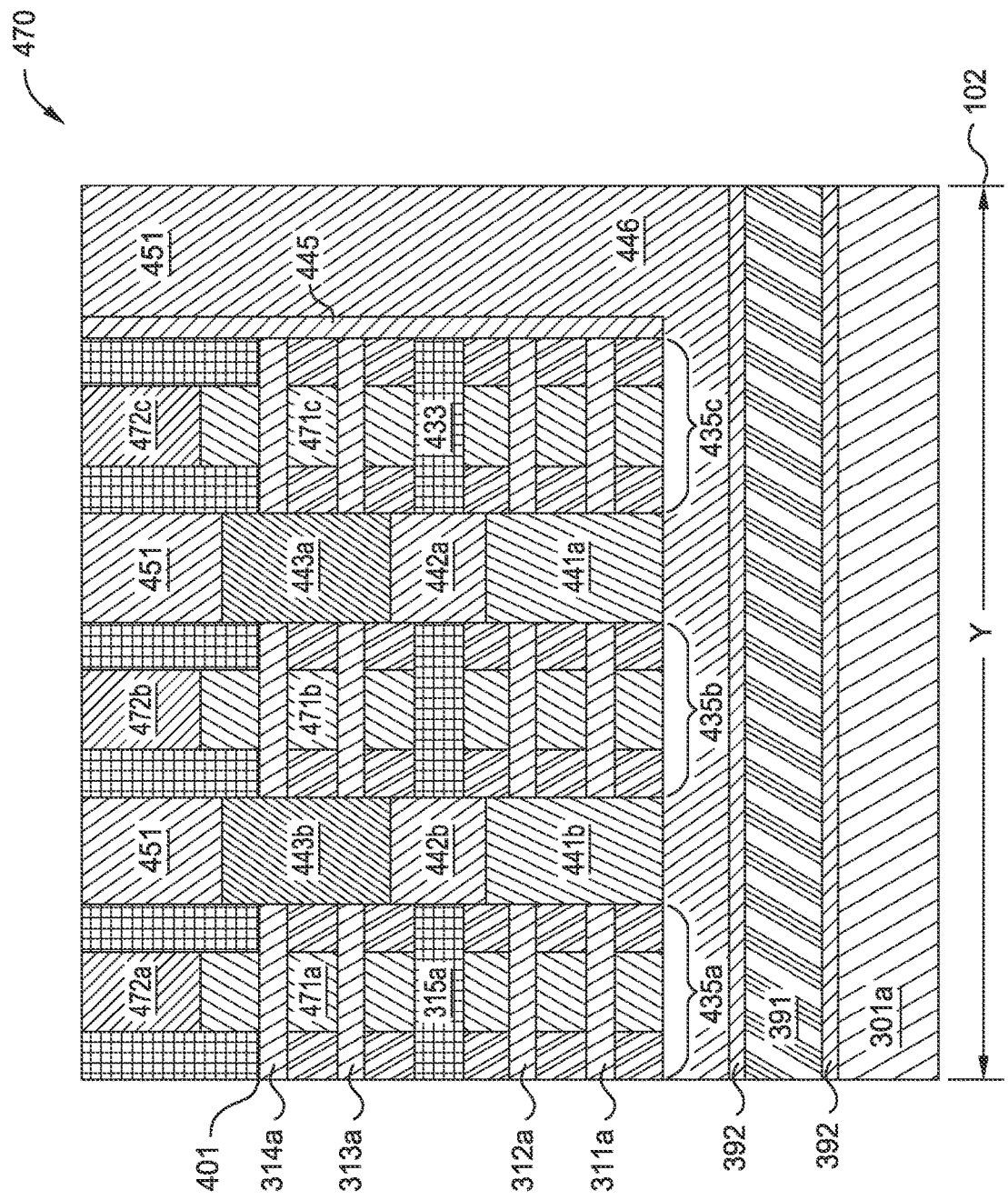

At step 450 in in FIGS. 4J and 4K, the fabricator forms a second dielectric layer on a top surface of the second S/D epi region. For example, the fabricator forms the layer 451 in a top surface 452 of the region 443a and a top surface 453 of the layer 442a. The fabricator also forms the layer 451 in the recess 437 and above the ILD layer 446. In some examples, the layer 451 also applies a polishing procedure such as CMP to the layers 412a-412 removing a region 455, which exposes the structures 411a-411c.

At steps 460 and 470 in FIGS. 4 L-4 M, the fabricator replaces the plurality of gate structures with a plurality of high-k metal gates (HKMGs) with self-aligned contact (SAC) caps. For example, at step 460 the fabricator removes the structures 411a-411c. In some examples, the fabricator also removes the SiGe layers, such as parts 304a, 316a, 317a, 318a, and 319a in structure 435a and corresponding layers in the structures 435b and 435c. At step 470, the fabricator forms HKMGs 471a, 471b, and 471c in the respective structures 435a-435c, followed by a HKMG recess and provides SAC caps 472a-472c on the HKMGs in the structures.

Returning back to method 200 of FIG. 2, at block 206 the fabricator forms a buried contact through the first S/D epi region. For example, the fabricator forms buried contact 130 as described in FIGS. 1B-C. In some examples, the process for forming the buried contact includes the fabrication steps shown in FIGS. 5A-J.

Figure 5A:
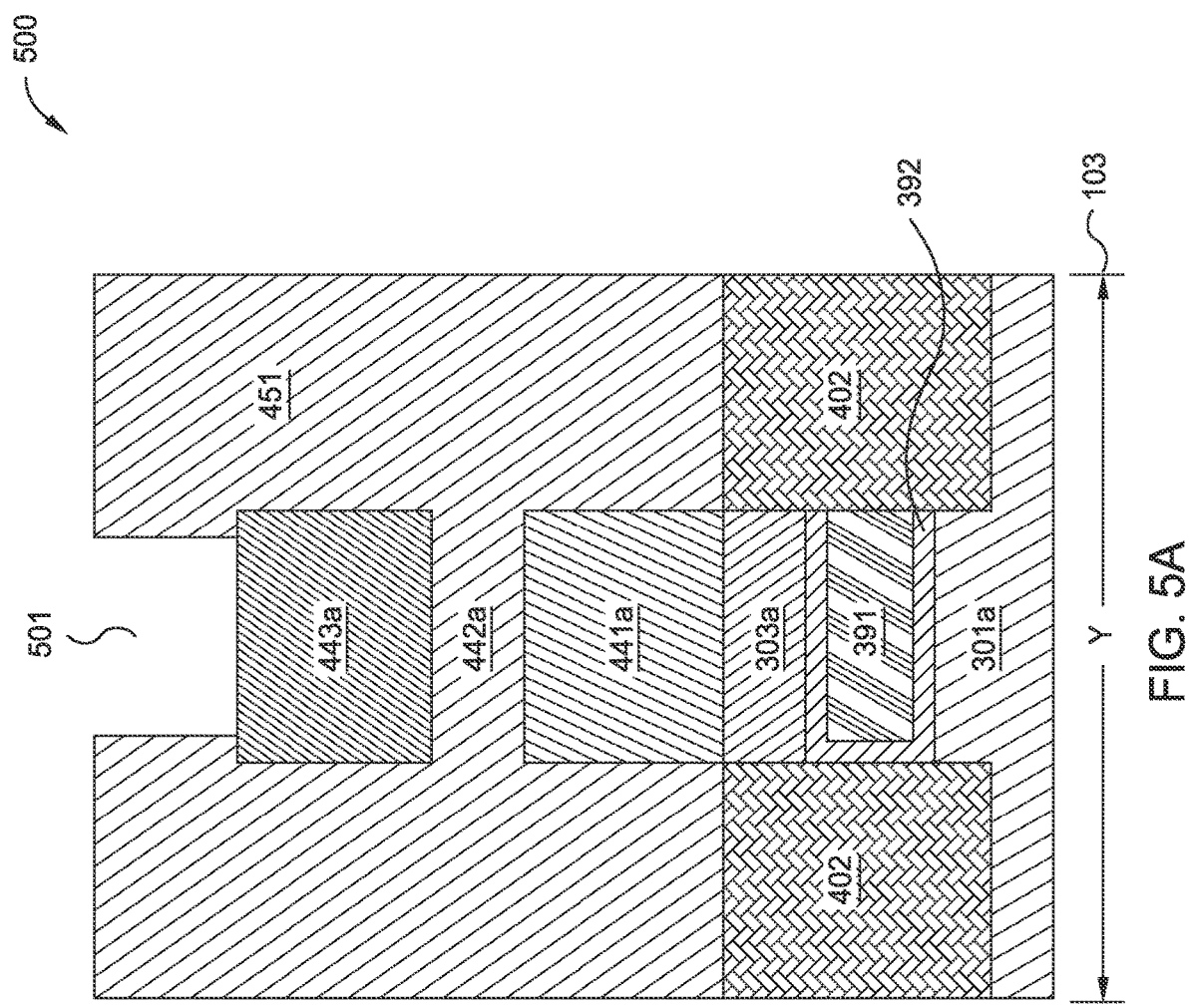
FIGS. 5A-5N illustrate several views of the stacked device during fabrication according to the method described in relation to FIG. 2, according to embodiments of the present disclosure.
Figure 5B:
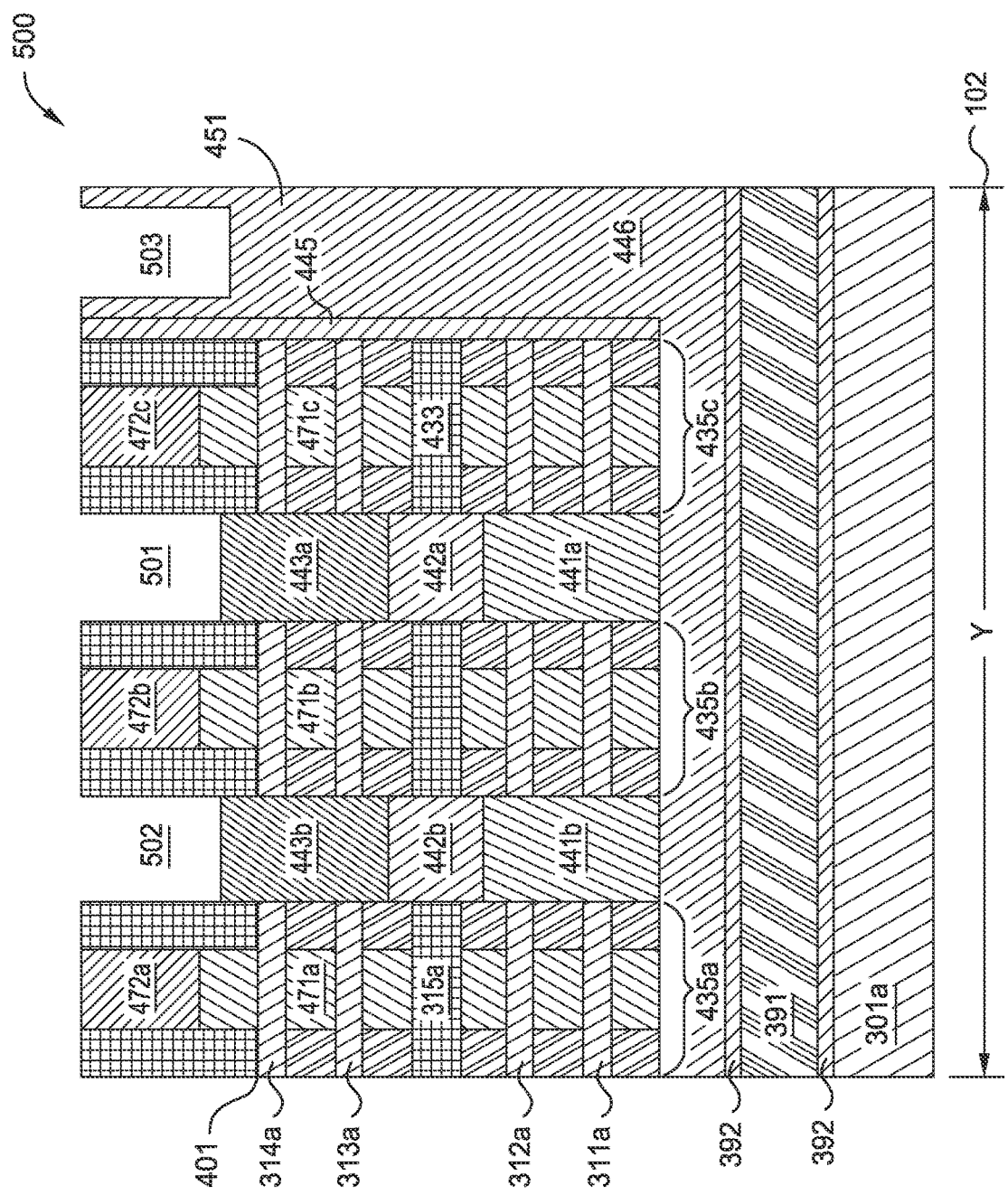
Figure 5C:
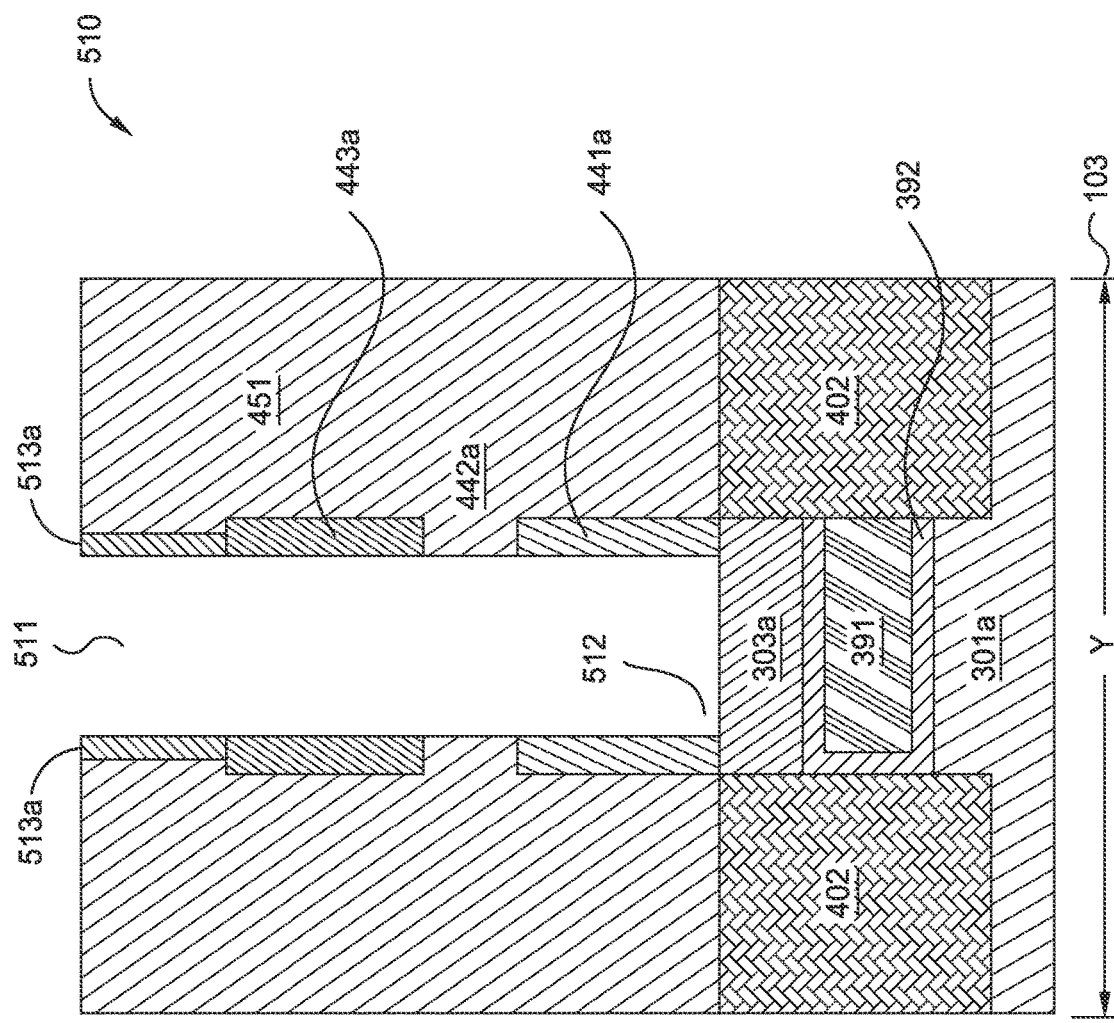
Figure 5D:
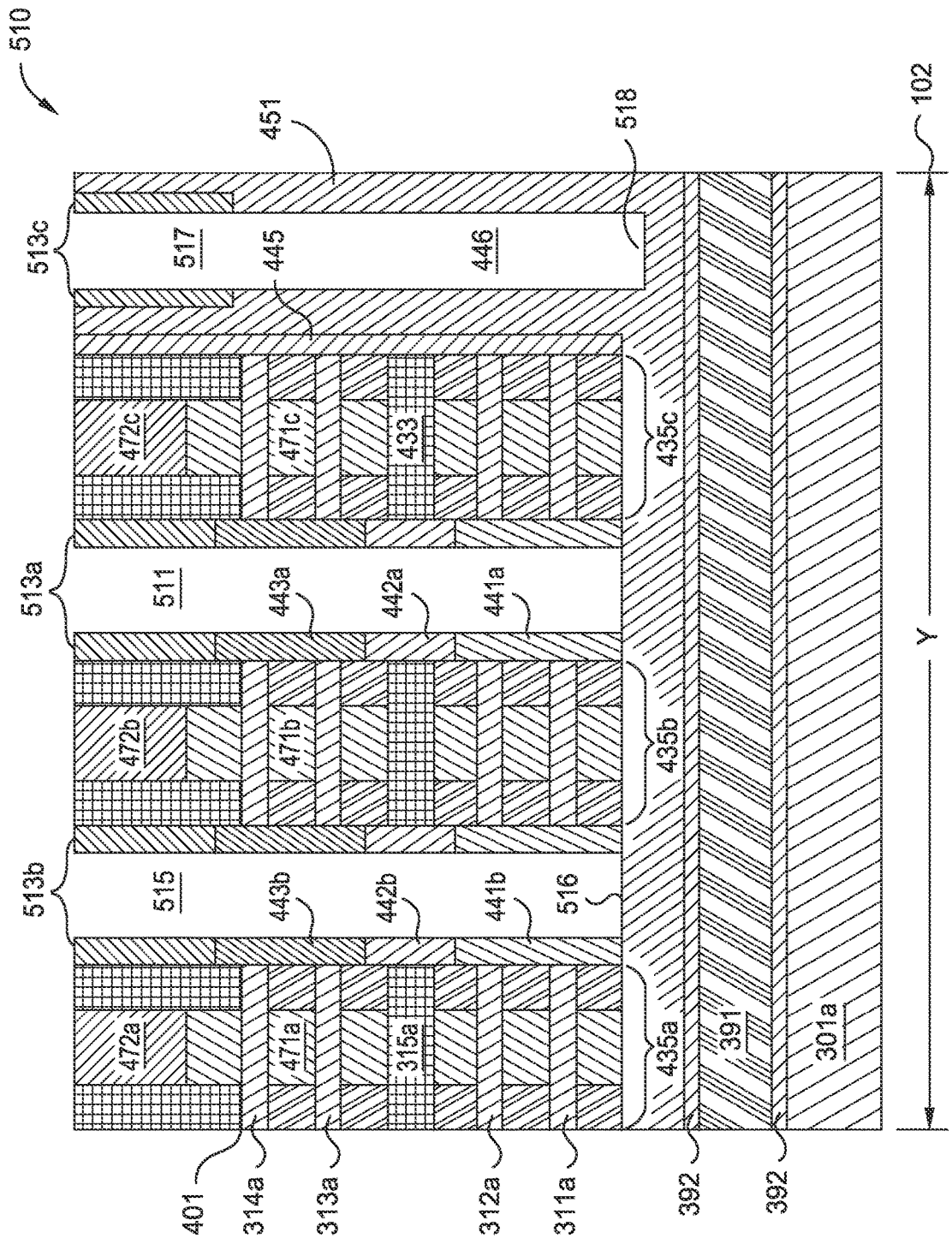
Figure 5F:
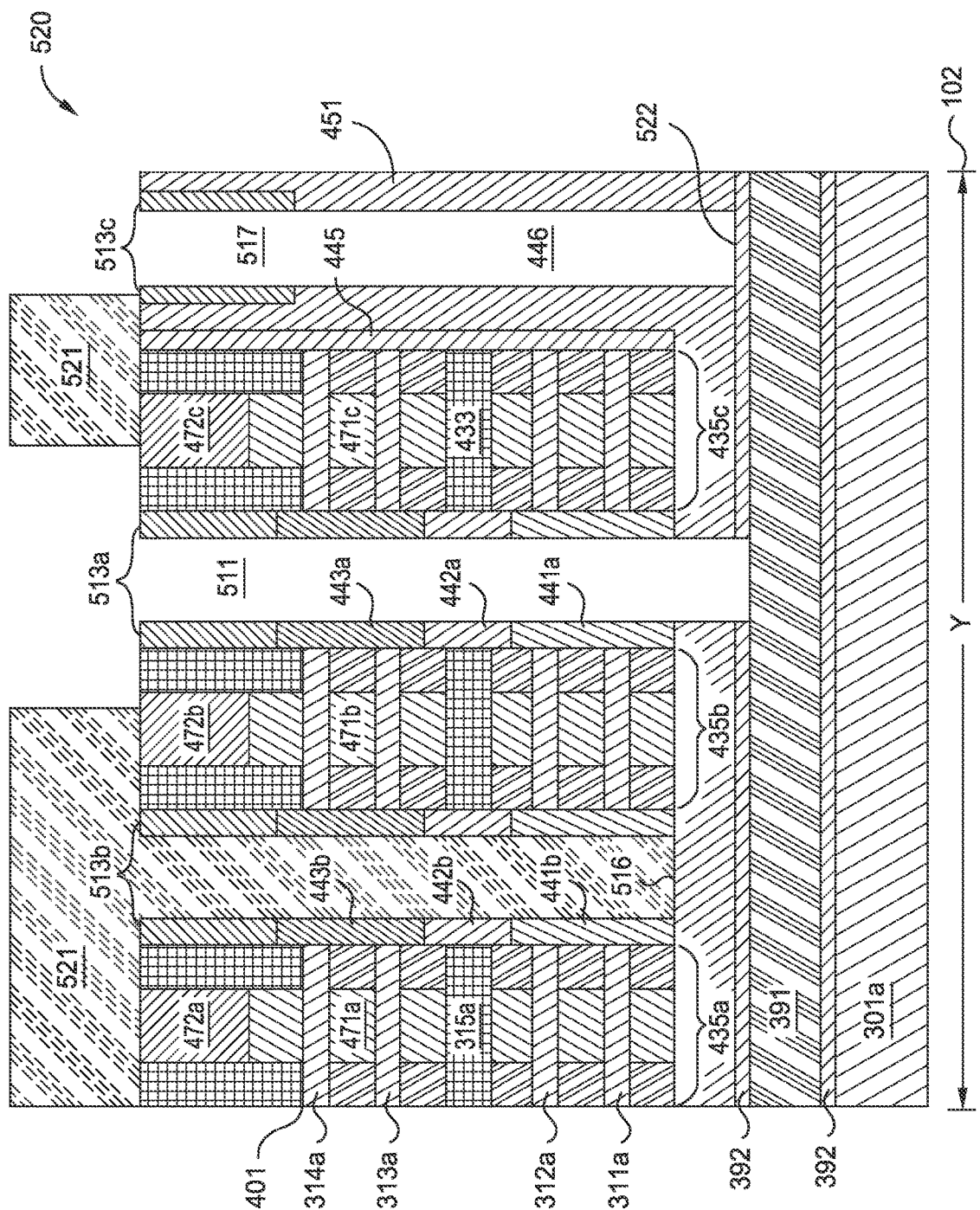
Figure 5H:
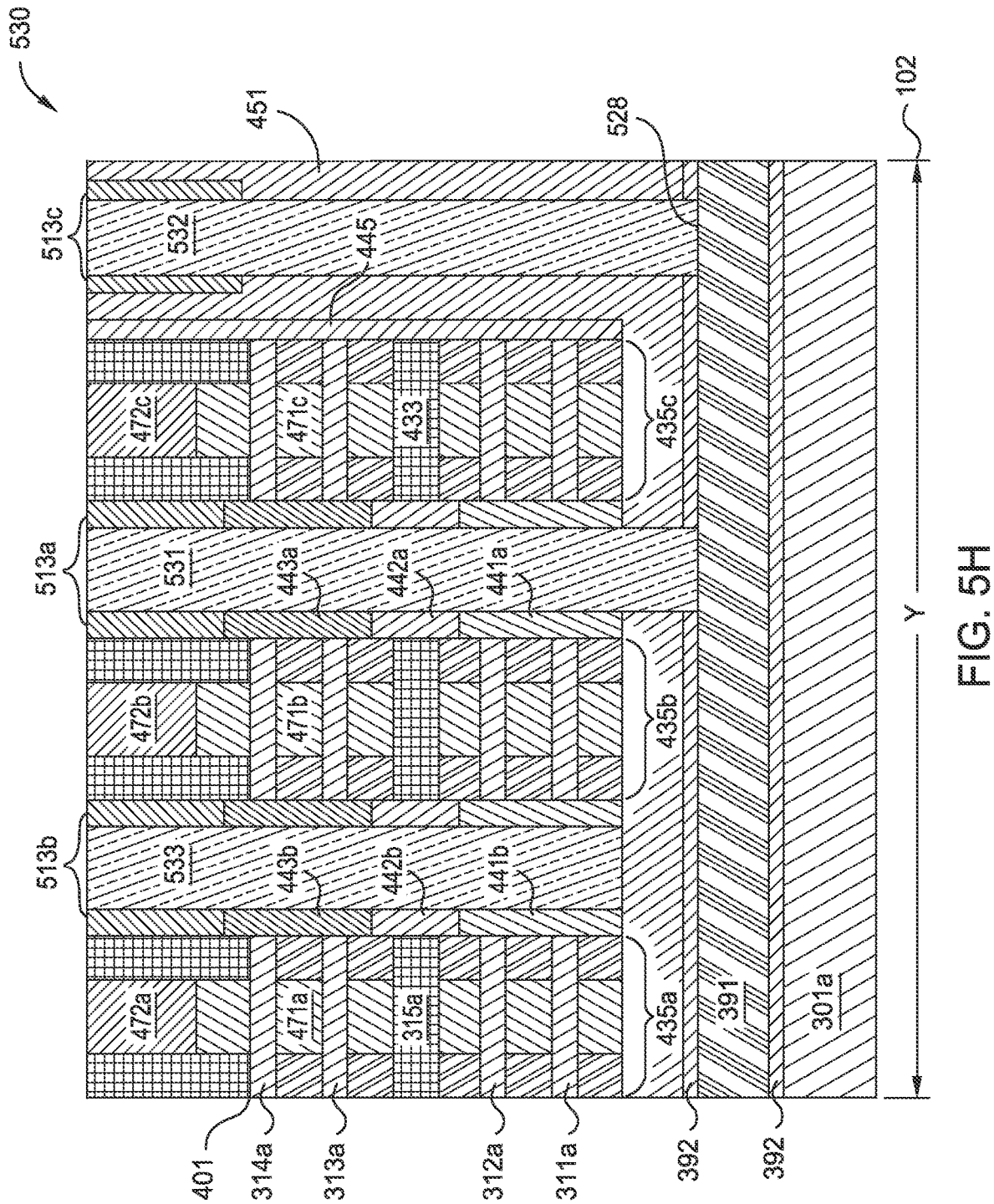
Figure 5J:
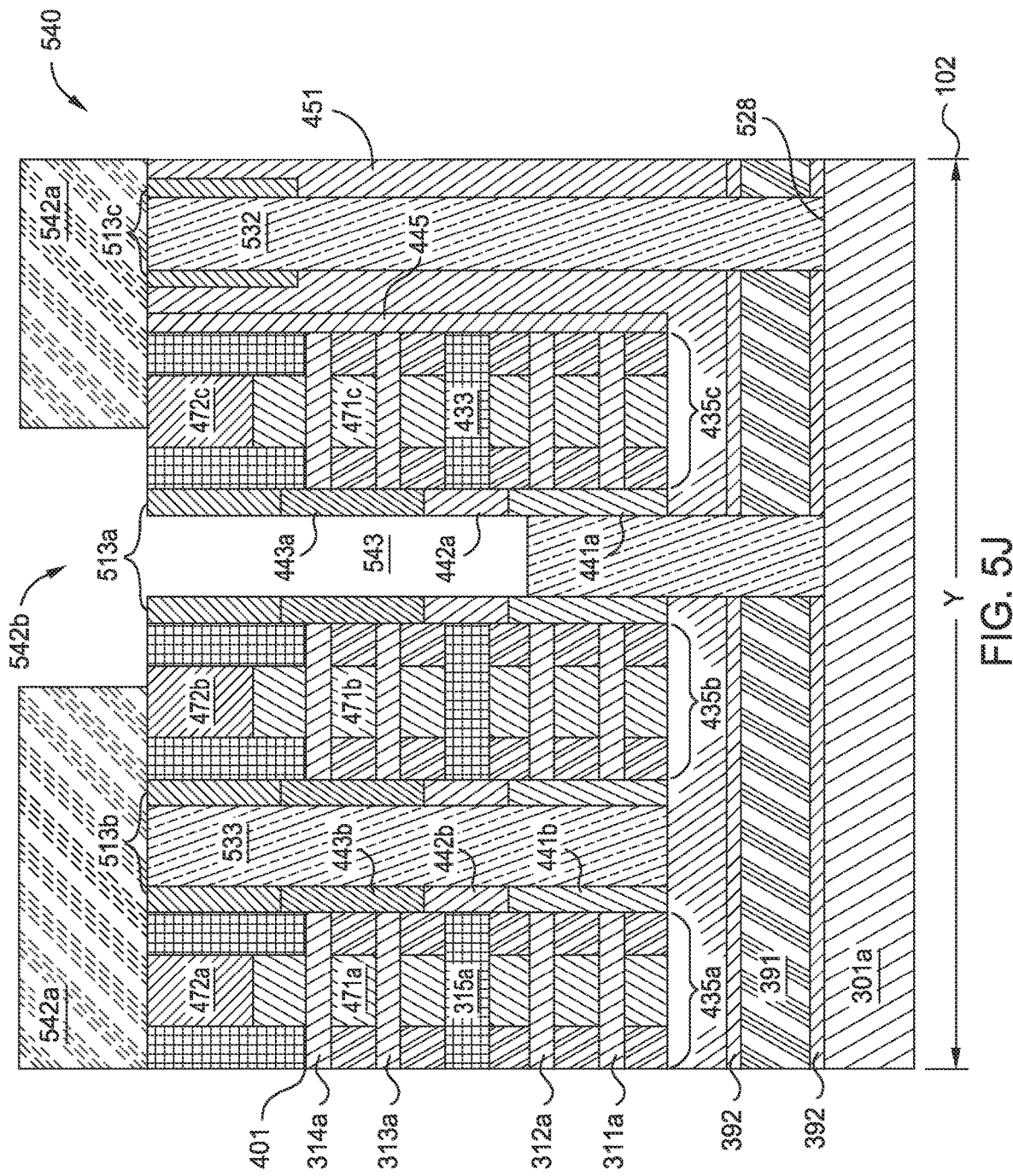
Figure 5K:
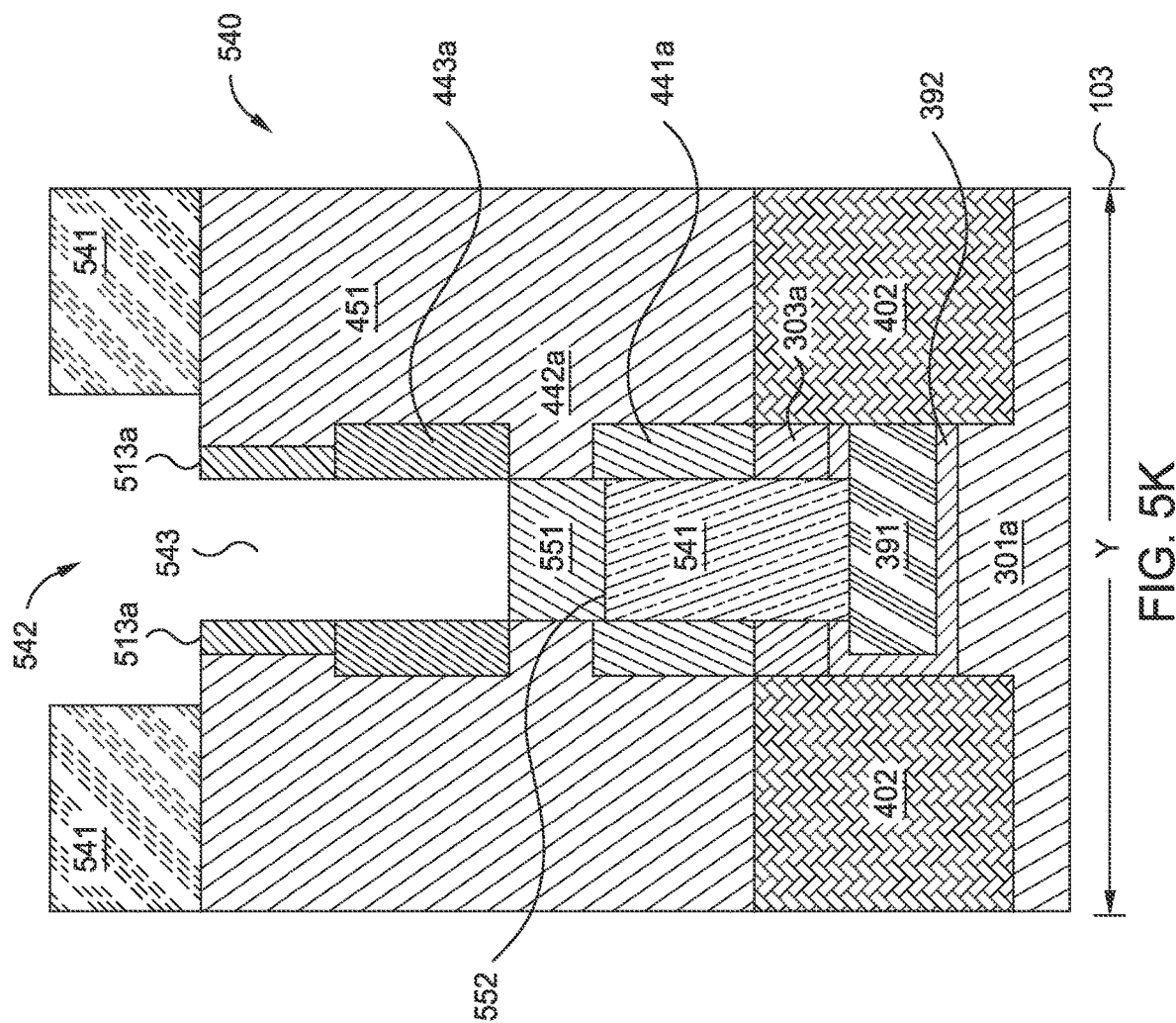
Figure 5L:
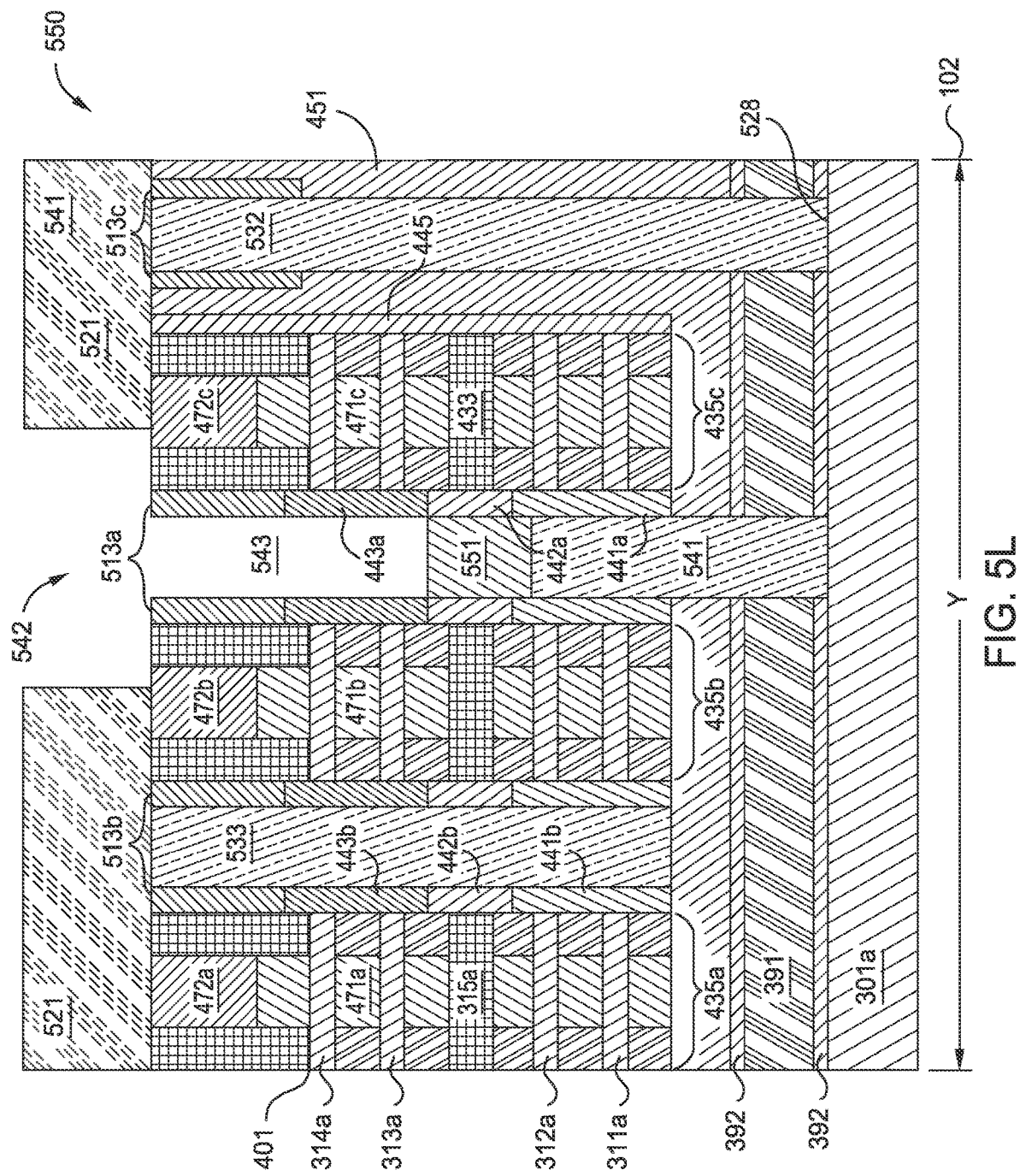
Figure 5M:
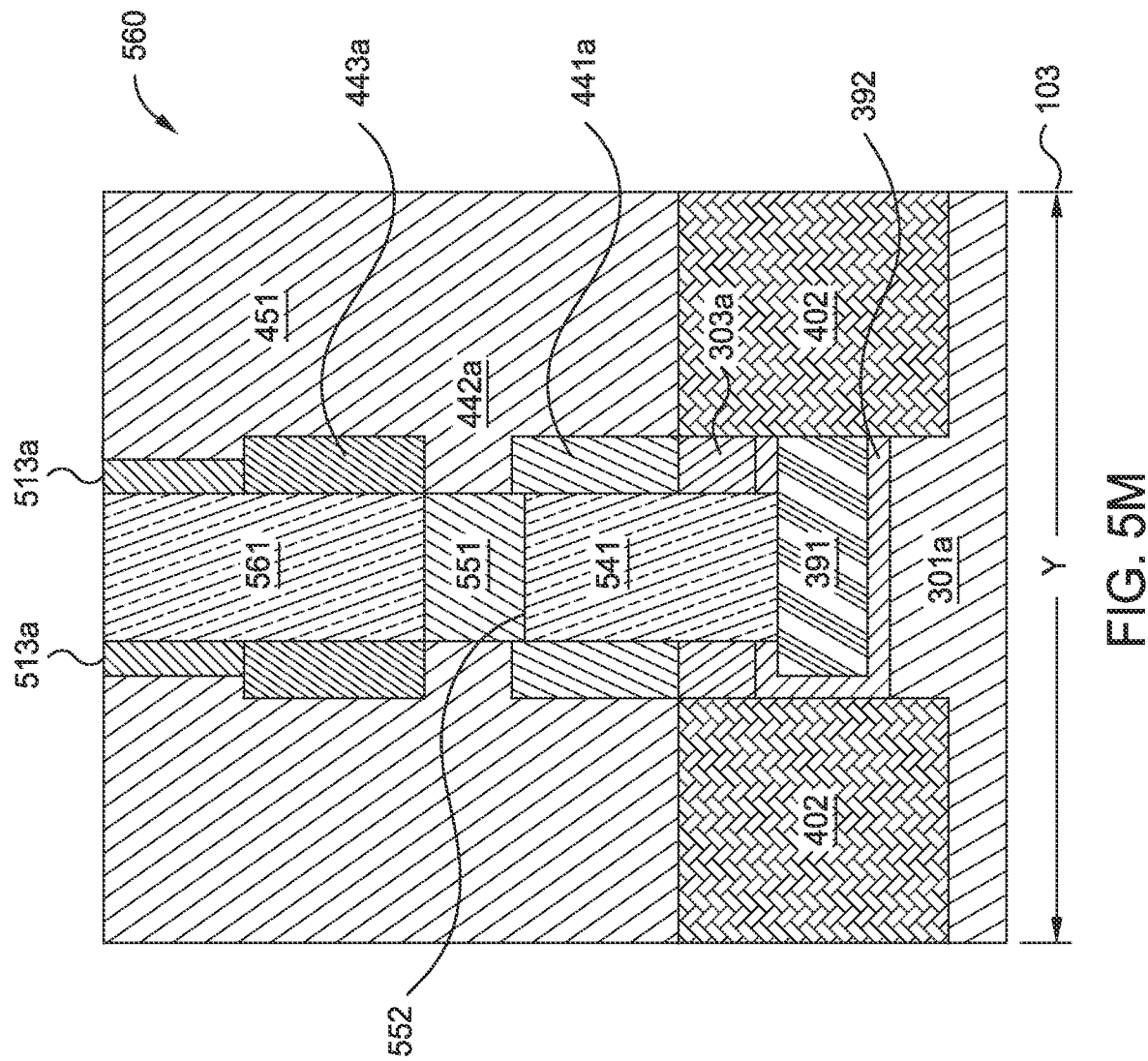
Figure 5N:
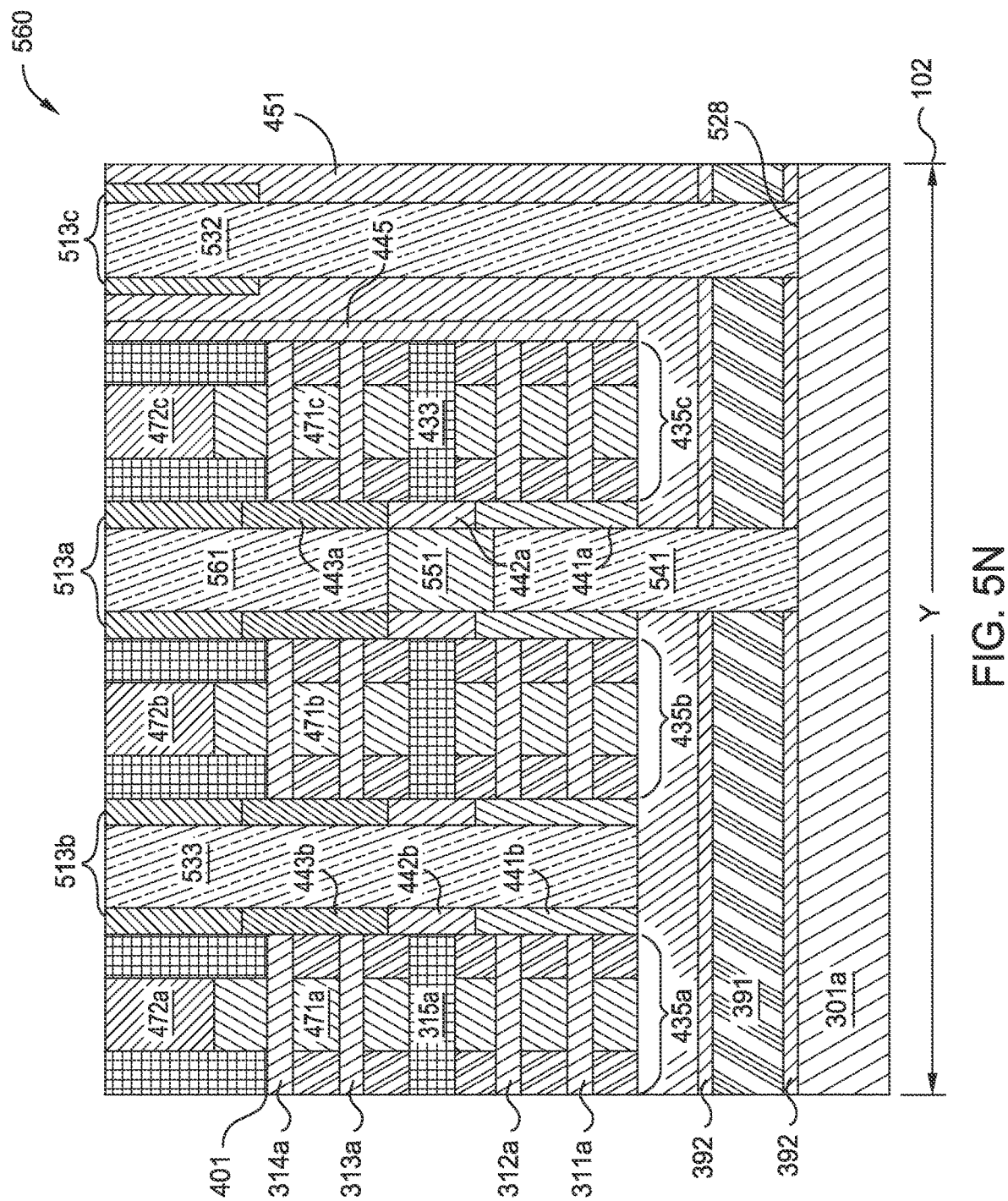

FIGS. 5A-5N illustrate several views of the stacked device during fabrication according to the method described in relation to FIG. 2, according to embodiments of the present disclosure. For example, at step 500 the fabricator patterns a first opening, such as opening 501, in the second dielectric layer, such as the layer 451, and between the structures 435b and 435c. In some examples, the fabricator also forms the opening 502 and 503 in the layer 451 where the opening 502 is between structures 435a and 435b and the opening 503 is above the ILD layer 446.

At step 510 and 520 in FIGS. 5C-5D, the fabricator forms spacers in the first opening. For example at step 510, the fabricator forms spacers 513a in the opening 501. In some examples, the fabricator also forms the spacers 513b and 513c in the openings 502 and 503. Additionally at steps 510 and 520, the fabricator etches a first void from a top side of the second S/D epi region, through the second S/D epi region, the first dielectric layer, and the first S/D epi region, to the dielectric layer 303a. For example, at step 510 the fabricator forms the void 511 through the regions 443a and 441a and layer 442b to top surface 512 of the dielectric layer 303a. In some examples, the fabricator also forms the voids 515 and 517 through the corresponding respective layers.

At step 520 in FIGS. 5E and 5F, the fabricator forms a mask layer 521, which opens the regions where a contact is needed to reach to buried metal line 391. The fabricator also further etches the voids 511 and 517 through the dielectric layer 303a and 392 to a top surface 522 of the buried metal line 391.

At step 530 in FIGS. 5G and 5H, the fabricator performs contact metallization processes to deposit a first metal connection in the openings. The metal deposition includes a silicide liner, such as Ti, Ni, NiPt, a metal adhesion layer, such as TiN, and a bulk low resistance metal fill, such as W, Co, or Ru, followed by metal CMP. In some examples, the metal connection 533 serves as a shared contact through the regions 441b and 443b and layer 442b. Additionally, the metal connection 532 is a wiring or other type of metal connection providing connectivity between a front-side back end of line (BEOL) interconnect and the buried metal line 391.

At step 540 in FIGS. 5I and 5J, the fabricator removes a portion of the first metal connection to form the buried contact. For example, the fabricator applies a mask layer 542a over portions over the various regions leaving an opening 542b over the metal connection 531 and removes portion 543 from the metal connection 531 to form the buried contact 541, which extends from the buried metal line 391 through the region 441a.

Returning back to method 200 of FIG. 2, at block 208 the fabricator forms a dielectric isolation layer on a top surface of the first S/D epi region and the buried contact. For example, as shown in step 550 of FIGS. 5K and 5L, the fabricator forms the layer 551 on at least a top surface 552 of the contact 541 as well as over the region 441a.

At block 210, the fabricator form a top contact through the second S/D epi region from the dielectric isolation layer to a top side of the stacked structure. For example, as shown in step 560 of FIGS. 5M and 5N, the fabricator forms the contact 561 in the void of the opening 542b. In some examples, the contact 561 is formed on at least a top surface 562 of the layer 551 to from the stacked device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A stacked device comprising:
    a first device comprising a first source/drain epitaxy (S/D epi) region;
    a second device comprising a second S/D epi region, where the second device is positioned over the first device in the stacked device;
    a dielectric isolation layer between the first device and the second device;
    a buried metal line;
    a buried contact formed through the first S/D epi region from the dielectric isolation layer to the buried metal line; and
    a top contact formed through the second S/D epi region from the dielectric isolation layer to a top side of the stacked device, wherein the top contact is separated from the buried contact via the dielectric isolation layer.

2. The stacked device of claim 1, wherein the first device comprises one of a PFET device or an NFET device, and wherein the second device comprises one of a PFET device or and NFET device.

3. The stacked device of claim 1, further comprising:
    a wired connection from the top side of the stacked device to the buried metal line.

4. The stacked device of claim 1, further comprising:
    a dielectric liner formed on at least one side of the buried metal line, wherein the buried contact is formed through the dielectric liner.

5. The stacked device of claim 1, further comprising:
    a third device comprising a third S/D epi region;
    a fourth device comprising a fourth S/D epi region, where the fourth device is positioned over the third device in the stacked device;
    an intermediate layer between the third device and the fourth device; and
    a shared contact formed through from the top side of the stacked device through the fourth S/D epi region, the intermediate layer, and the third S/D epi region.

6. The stacked device of claim 1, further comprising:
    a plurality of high-k metal gates (HKMGs) with self-aligned contact (SAC) caps, wherein the first device and the second device are positioned between a first HKMG and a second HKMG of the plurality of HKMGs.

7. A method, comprising:
    forming, in a stacked structure, a buried metal line;
    forming a first source/drain epitaxy (S/D epi) region and a second S/D epi region where the second S/D epi region is positioned over the first S/D epi region in the stacked structure;
    forming a buried contact through the first S/D epi region;
    forming a dielectric isolation layer on a top surface of the first S/D epi region and the buried contact; and
    forming a top contact through the second S/D epi region from the dielectric isolation layer to a top side of the stacked structure, wherein the top contact is separated from the buried contact via the dielectric isolation layer.

8. The method of claim 7, further comprising:
    forming a starting substrate base;
    forming, using the starting substrate base, a layer stack;
    patterning the layer stack into a structured layer stack;
    forming a protective sidewall spacer on at least two sides of the structure layer stack;
    etching the structured layer stack; and
    forming the buried metal line in the structured layer stack.

9. The method of claim 7, wherein forming the first S/D epi region and the second S/D epi region comprises:
    forming a plurality of gate structures on the stacked structure;

forming a plurality of spaces between the plurality of gate structures;

growing the first S/D epi region in a first space between a first gate and a second gate of the plurality of gate structures;

forming a first dielectric layer on a top surface of the first S/D epi region;

growing the second S/D epi region in the first space on a top surface of the first dielectric layer; and forming a second dielectric layer on a top surface of the second S/D epi region; and wherein the method further comprises:

replacing the plurality of gate structures with a plurality of high-k metal gates (HKMGs) with self-aligned contact (SAC) caps.

10. The method of claim 9, further comprising:

patterning a first opening in the second dielectric layer;

forming spacers in the first opening;

wherein forming the buried contact comprises:

etching a first void from a top side of the second S/D epi region, through the second S/D epi region, the first dielectric layer, and the first S/D epi region, to the buried metal line;

performing contact metallization processes to deposit a first metal connection in the first void from the buried metal line to the top side of the stacked structure; and removing a portion of the first metal connection to form the buried contact.

11. The method of claim 10, wherein forming the top contact comprises:

performing a contact metallization processes to deposit the top contact in the first void from the dielectric isolation layer to the top side of the stacked structure.

12. The method of claim 7, wherein the first S/D epi region comprises one of a PFET device or an NFET device, and wherein the second S/D epi region comprises one of a PFET device or and NFET device.

13. The method of claim 7, further comprising:

forming a wired connection from the top side of the stacked structure to the buried metal line; and forming a shared contact the top side of the stacked structure through a third S/D region and a fourth S/D region.

14. The method of claim 7, further comprising:

forming a dielectric liner on at least one side of the buried metal line, wherein the buried contact is formed through the dielectric liner.

15. A stacked field-effect transistor (FET) device comprising:

a first device comprising a first source/drain epitaxy (S/D epi) region;

a second device comprising a second S/D epi region, where the second device is positioned over the first device in the stacked FET device;

a dielectric isolation layer between the first device and the second device;

a buried metal line;

a buried contact formed through the first S/D epi region from the dielectric isolation layer to the buried metal line;

a top contact formed through the second S/D epi region from the dielectric isolation layer to a top side of the stacked FET device, wherein the top contact is separated from the buried contact via the dielectric isolation layer; and a wired connection from a top of the stacked FET device to the buried metal line.

16. The stacked FET device of claim 15, wherein the first device comprises one of a PFET device or an NFET device, and wherein the second device comprises one of a PFET device or and NFET device.

17. The stacked FET device of claim 15, wherein the wired connection provides a power signal to the buried metal line.

18. The stacked FET device of claim 15, further comprising:

a dielectric liner formed on at least one side of the buried metal line, wherein the buried contact is formed through the dielectric liner.

19. The stacked FET device of claim 15, further comprising:

a third device comprising a third S/D epi region;

a fourth device comprising a fourth S/D epi region, where the fourth device is positioned over the third device in the stacked FET device;

an intermediate layer between the third device and the fourth device; and a shared contact formed through from the top side of the stacked FET device through the fourth S/D epi region, the intermediate layer, and the third S/D epi region to the buried metal line.

20. The stacked FET device of claim 15, further comprising:

a plurality of high-k metal gates (HKMGs) with self-aligned contact (SAC) caps, wherein the first device and the second device are positioned between a first HKMG and a second HKMG of the plurality of HKMGs.

* * * * *